(12) United States Patent
Yanagisawa

(10) Patent No.: US 7,627,210 B2
(45) Date of Patent: Dec. 1, 2009

(54) MANUFACTURING METHOD OF OPTICAL-ELECTRICAL SUBSTRATE AND OPTICAL-ELECTRICAL SUBSTRATE

(75) Inventor: Kenji Yanagisawa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 71 days.

(21) Appl. No.: 11/987,064

(22) Filed: Nov. 27, 2007

(65) Prior Publication Data
US 2008/0131050 A1 Jun. 5, 2008

(30) Foreign Application Priority Data
Nov. 30, 2006 (JP) ............ P.2006-324310

(51) Int. Cl.
*G02B 6/34* (2006.01)
*G02B 6/42* (2006.01)

(52) U.S. Cl. ......................... 385/36; 385/88

(58) Field of Classification Search ........... 385/36, 385/88
See application file for complete search history.

(56) References Cited

U.S. PATENT DOCUMENTS
2008/0044133 A1* 2/2008 Degroot et al. ............ 385/31

FOREIGN PATENT DOCUMENTS
JP 2000-304953 11/2000

* cited by examiner

*Primary Examiner*—Jerry T Rahll
(74) *Attorney, Agent, or Firm*—Drinker Biddle & Reath LLP

(57) ABSTRACT

In a manufacturing method of an optical-electrical substrate comprising a wiring substrate, an optical waveguide which is disposed on the wiring substrate and transmits an optical signal, and mirrors for reflecting the optical signal, insulating members having smooth inclined surfaces are formed on the wiring substrate and thereafter, a metal film is formed on the smooth inclined surfaces and the mirrors are formed.

5 Claims, 34 Drawing Sheets

MANUFACTURING METHOD OF OPTICAL-ELECTRICAL SUBSTRATE AND OPTICAL-ELECTRICAL SUBSTRATE

This application claims priority to Japanese Patent Application No. 2006-324310, filed Nov. 30, 2006, in the Japanese Patent Office. The priority application is incorporated by reference in its entirety.

TECHNICAL FIELD

The present disclosure relates to a manufacturing method of an optical-electrical substrate, and particularly to a manufacturing method of an optical-electrical substrate comprising an optical waveguide which is disposed on a wiring substrate and transmits an optical signal, and a mirror for reflecting the optical signal.

RELATED ART

In recent years, with a speedup in information communication, light has been used as a medium of information communication instead of an electrical signal. In such an optical communication field, it is necessary to convert an optical signal into an electrical signal or convert an electrical signal into an optical signal, or it is necessary to perform various processing such as modulation to light in optical communication. Because of this, development of an optical-electrical substrate for performing the conversion processing described above has been advanced.

FIG. 1 is a sectional diagram of a related-art optical-electrical substrate.

As shown in FIG. 1, a related-art optical-electrical substrate 200 has a wiring substrate 201, an optical waveguide 202, through vias 225, wiring 227, a solder resist 228, mirrors 231, 232, a light emitting element 234, and a light receiving element 235.

The wiring substrate 201 has a substrate body 208, vias 211 extending through the substrate body 208, upper wiring 212 disposed on an upper surface 208A of the substrate body 208, lower wiring 213 which is disposed on a lower surface 208B of the substrate body 208 and is electrically connected to the upper wiring 212 through the vias 211, a solder resist 215 which is disposed on the lower surface 208B of the substrate body 208 and protects the lower wiring 213, and solder balls 216 disposed on the lower wiring 213.

On the wiring substrate 201 constructed thus, the optical waveguide 202 in which the light emitting element 234 and the light receiving element 235 are arranged is bonded by an adhesive 218.

FIG. 2 is a diagram when the optical waveguide shown in FIG. 1 is viewed from F.

Referring to FIGS. 1 and 2, the optical waveguide 202 has a first cladding layer 221, a core part 222 and a second cladding layer 223. The core part 222 is means for transmitting an optical signal, and is formed on the first cladding layer 221. The second cladding layer 223 is disposed on the first cladding layer 221 so as to cover the core part 222. The core part 222 is constructed by a material with a refractive index higher than that of the first cladding layer 221 and the second cladding layer 223.

Referring to FIG. 1, the through via 225 is disposed so as to extend through the optical waveguide 202. The through via 225 is means for electrically connecting the upper wiring 212 of the wiring substrate 201 to the wiring 227 formed on the second cladding layer 223.

The solder resist 228 is disposed on the second cladding layer 223 so as to cover the wiring 227. The solder resist 228 has an opening for exposing the wiring 227 of the portion to which the light emitting element 234 and the light receiving element 235 are connected, an optical guide inlet 241 for guiding an optical signal from the light emitting element 234 to the core part 222, and an optical guide outlet 242 for guiding an optical signal reflected by the mirror 232 to the light receiving element 235.

The mirrors 231, 232 are disposed in V-shaped groove parts 244, 245 formed in the optical waveguide 202 from the side of the first cladding layer 221. The mirror 231 is means for reflecting an optical signal emitted from a light emitting part 246 of the light emitting element 234 toward the core part 222. The mirror 232 is means for reflecting an optical signal transmitted by the core part 222 toward a light receiving part 247 of the light receiving element 235. The optical signal guided to the light receiving element 235 is converted into an electrical signal. The groove parts after forming the mirrors 231, 232 are filled with a cladding material 249 as a reinforcing material.

FIGS. 3 to 5 are diagrams showing a related-art mirror formation step.

A method for forming the mirrors 231, 232 shown in FIG. 1 will be described with reference to FIGS. 3 to 5. First, in a step shown in FIG. 3, by a well known technique, a first cladding layer 221, a core part 222 and a second cladding layer 223 are sequentially laminated and an optical waveguide 202 is formed.

Next, in a step shown in FIG. 4, V-shaped groove parts 244, 245 for dividing the core part 222 are formed in the optical waveguide 202 from the side of the first cladding layer 221 by a dicer (dicing apparatus). In this case, inclined surfaces 244a, 244b constructing the groove part 244 are formed so that angles $\theta_{12}$, $\theta_{13}$ between the inclined surfaces 244a, 244b and a lower surface 221A of the first cladding layer 221 respectively become 45°. Also, inclined surfaces 245a, 245b constructing the groove part 245 are formed so that angles $\theta_{14}$, $\theta_{15}$ between the inclined surfaces 245a, 245b and the lower surface 221A of the first cladding layer 221 respectively become 45°.

Then, in a step shown in FIG. 5, a metal film is formed on the groove parts 244, 245. Consequently, the mirror 231 is formed on the inclined surface 244b and the mirror 232 is formed on the inclined surface 245a (for example, see Japanese Patent Unexamined Publication No. 2000-304953 (Patent Reference 1)).

However, the inclined surfaces 244b, 245a formed by the dicer (dicing apparatus) are not smooth surfaces, so that shapes (concretely, fine unevenness) of the inclined surfaces 244b, 245a are transferred to reflective surfaces (surfaces for reflecting an optical signal) of the mirrors 231, 232 formed on the inclined surfaces 244b, 245a. Consequently, there was a problem of increasing transmission loss of the optical signal reflected by the mirrors 231, 232.

SUMMARY

Exemplary embodiments of the present invention provide a manufacturing method of an optical-electrical substrate capable of reducing transmission loss of an optical signal by a mirror.

According to one standpoint of the present invention, there is provided a manufacturing method of an optical-electrical substrate comprising a wiring substrate, an optical waveguide which is disposed on the wiring substrate and transmits an optical signal, and a mirror for reflecting the optical signal, including an insulating member formation step of forming an insulating member having a smooth inclined surface on the wiring substrate, and a mirror formation step of forming the mirror on the smooth inclined surface.

According to the present invention, by forming an insulating member having a smooth inclined surface on a wiring substrate and thereafter forming a mirror on the smooth inclined surface, a surface for reflecting an optical signal of the mirror can be formed in a smooth surface, so that transmission loss of the optical signal by the mirror can be reduced.

Also, the insulating member formation step may include a preparation step of a mold for insulating member formation, the mold having a groove part corresponding to a shape of the insulating member and also transmitting ultraviolet rays, a liquid resin filling step of filling the groove part with a liquid ultraviolet curing resin after the mold for insulating member formation is pressed on the wiring substrate so that the groove part is opposed to the wiring substrate, a resin curing step of irradiating the liquid ultraviolet curing resin with ultraviolet rays through the mold for insulating member formation pressed on the wiring substrate and curing the liquid ultraviolet curing resin, and a removal step of the mold for insulating member formation from the wiring substrate.

Thus, after the mold for insulating member formation having the groove part corresponding to a shape of the insulating member and also transmitting ultraviolet rays is pressed on the wiring substrate, the groove part is filled with the liquid ultraviolet curing resin and thereafter, the liquid ultraviolet curing resin is irradiated with ultraviolet rays through the mold for insulating member formation pressed on the wiring substrate and the liquid ultraviolet curing resin is cured and the insulating member is formed and thereby, the inclined surface on which the mirror is formed can be formed without using a dicer, so that transmission loss of an optical signal by the mirror can be reduced.

Also, the wiring substrate has a step part in the portion corresponding to a formation region of the mirror, and the insulating member formation step may include a preparation step of a mold for insulating member formation, the mold having a notched part corresponding to a shape of the insulating member and also transmitting ultraviolet rays, a liquid resin filling step of filling space formed by the step part and the mold for insulating member formation with a liquid ultraviolet curing resin after the mold for insulating member formation is pressed on the wiring substrate so that the step part of the wiring substrate is opposed to the mold for insulating member formation of the portion in which the notched part is formed, a resin curing step of irradiating the liquid ultraviolet curing resin with ultraviolet rays through the mold for insulating member formation pressed on the wiring substrate and curing the liquid ultraviolet curing resin, and a removal step of the mold for insulating member formation from the wiring substrate.

Thus, after the mold for insulating member formation having the notched part corresponding to a shape of the insulating member and also transmitting ultraviolet rays is pressed on the wiring substrate, space formed by the step part and the mold for insulating member formation is filled with the liquid ultraviolet curing resin and thereafter, the liquid ultraviolet curing resin is irradiated with ultraviolet rays through the mold for insulating member formation pressed on the wiring substrate and the liquid ultraviolet curing resin is cured and the insulating member is formed and thereby, the inclined surface on which the mirror is formed can be formed without using a dicer, so that transmission loss of an optical signal by the mirror can be reduced.

According to the present invention, transmission loss of an optical signal by a mirror can be reduced.

Other features and advantages may be apparent from the following detailed description, the accompanying drawings and the claims.

DETAILED DESCRIPTION

Next, embodiments of the present invention will be described based on the drawings.

First Embodiment

Figure 1:
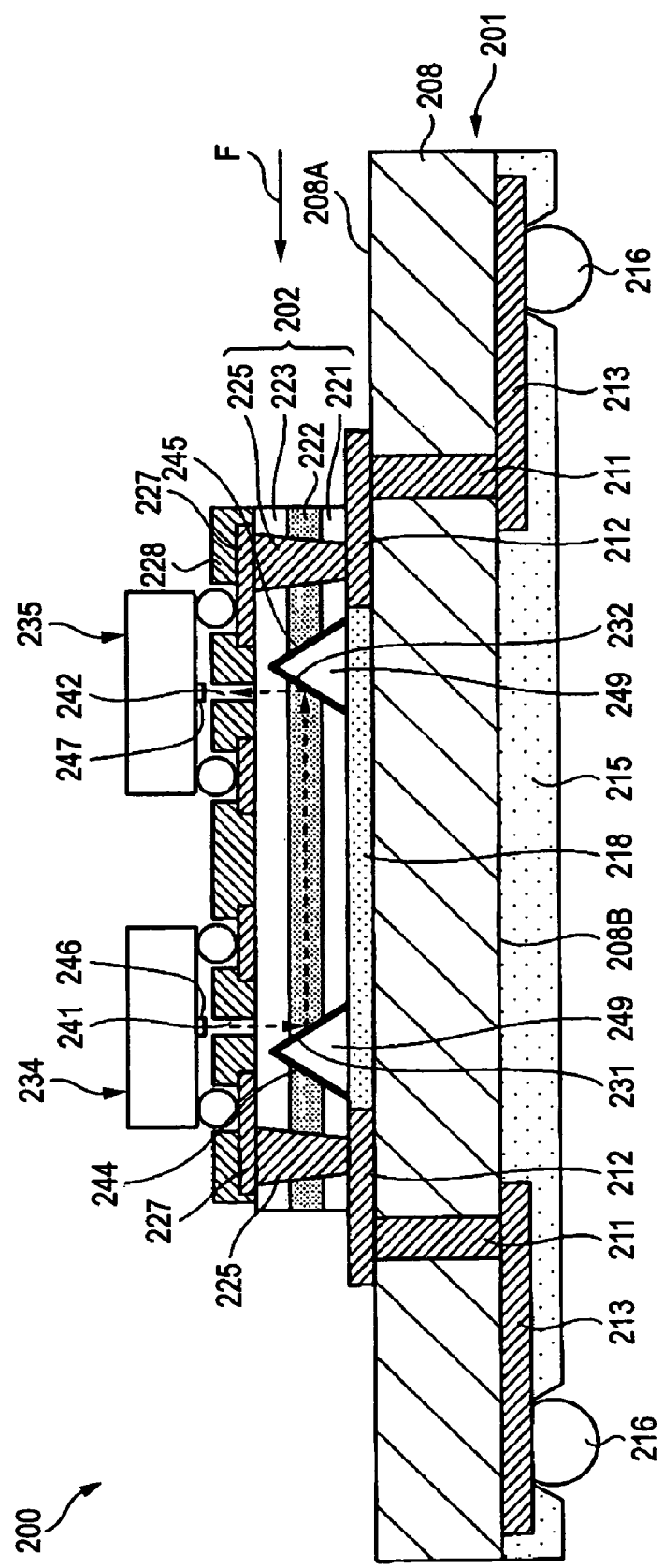
FIG. 1 is a sectional diagram of a related-art optical-electrical substrate.
Figure 2:
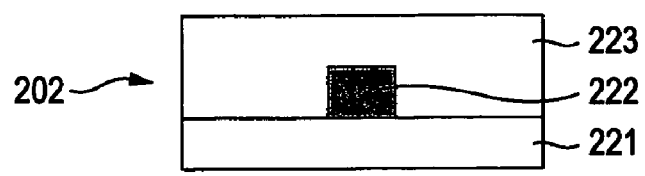
FIG. 2 is a diagram when an optical waveguide shown in FIG. 1 is viewed from F.
Figure 3:
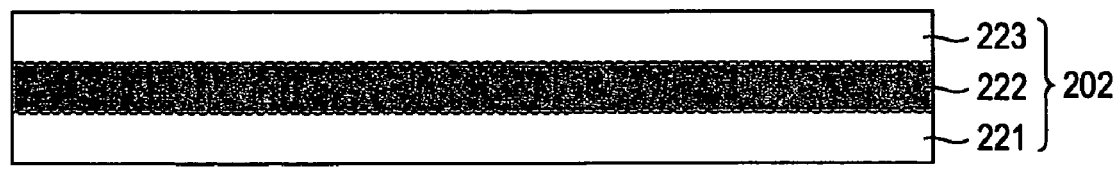
FIG. 3 is a diagram showing a related-art mirror formation step (first).
Figure 4:
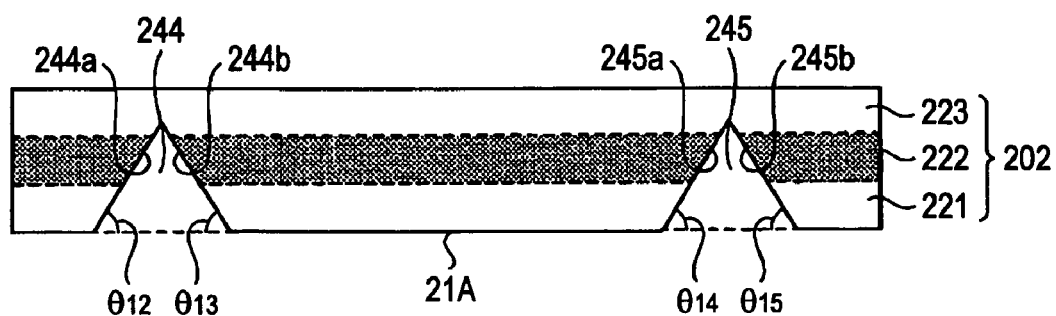
FIG. 4 is a diagram showing the related-art mirror formation step (second).
Figure 5:
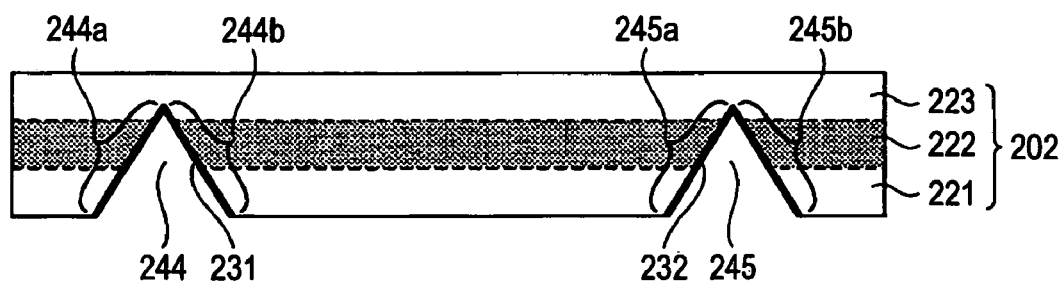
FIG. 5 is a diagram showing a related-art mirror formation step (third).
Figure 6:
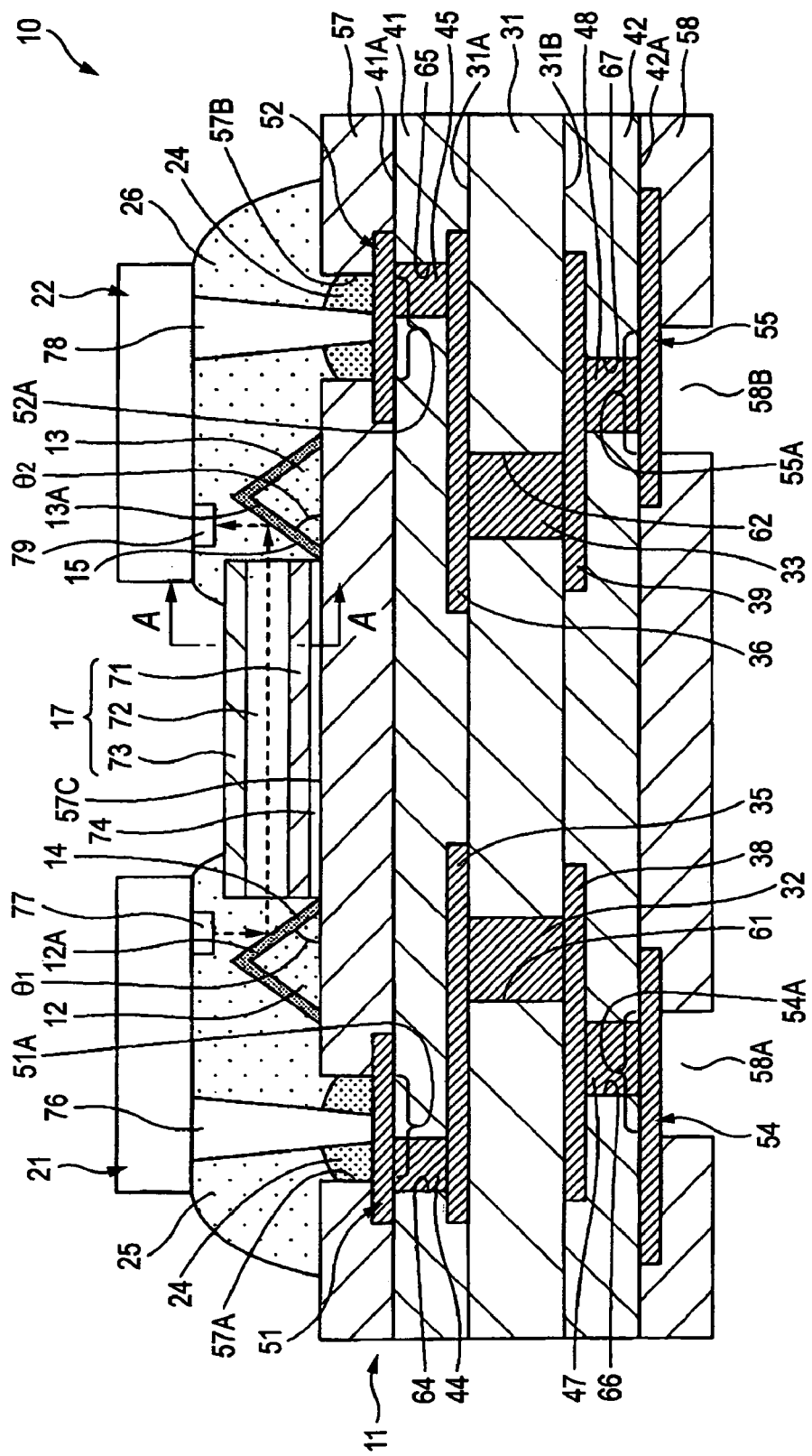
FIG. 6 is a sectional diagram of an optical-electrical substrate according to a first embodiment of the present invention.

FIG. 6 is a sectional diagram of an optical-electrical substrate according to a first embodiment of the present invention.

Referring to FIG. 6, an optical-electrical substrate 10 of the first embodiment has a wiring substrate 11, insulating members 12, 13, mirrors 14, 15, an optical waveguide 17, a light emitting element 21, a light receiving element 22, solder 24, and underfill resins 25, 26.

The wiring substrate 11 has a core substrate 31, through vias 32, 33, wirings 35, 36, 38, 39, insulating layers 41, 42, vias 44, 45, 47, 48, wiring patterns 51, 52, 54, 55, and solder resists 57, 58.

The core substrate 31 is formed in a plate shape and has through holes 61, 62. The through via 32 is disposed in the through hole 61. One end of the through via 32 is connected to the wiring 35, and the other end of the through via 32 is connected to the wiring 38. The through via 33 is disposed in the through hole 62. One end of the through via 33 is connected to the wiring 36, and the other end of the through via 33 is connected to the wiring 39.

The wiring 35 is disposed on an upper surface 31A of the core substrate 31 of the portion corresponding to a formation position of the through via 32. The wiring 35 is connected to the through via 32 and the via 44. The wiring 36 is disposed on the upper surface 31A of the core substrate 31 of the portion corresponding to a formation position of the through via 33. The wiring 36 is connected to the through via 33 and the via 45.

The wiring 38 is disposed on a lower surface 31B of the core substrate 31 of the portion corresponding to a formation position of the through via 32. The wiring 38 is connected to the through via 32 and the via 47. The wiring 38 is electrically connected to the wiring 35 through the through via 32.

The wiring 39 is disposed on the lower surface 31B of the core substrate 31 of the portion corresponding to a formation position of the through via 33. The wiring 39 is connected to the through via 33 and the via 48. The wiring 39 is electrically connected to the wiring 36 through the through via 33.

The insulating layer 41 is disposed on the upper surface 31A of the core substrate 31 so as to cover the wirings 35, 36. The insulating layer 41 has an opening 64 for exposing a part of the wiring 35 and an opening 65 for exposing a part of the wiring 36. The insulating layer 42 is disposed on the lower surface 31B of the core substrate 31 so as to cover the wirings 38, 39. The insulating layer 42 has an opening 66 for exposing a part of the wiring 38 and an opening 67 for exposing a part of the wiring 39.

The via 44 is disposed in the opening 64. One end of the via 44 is connected to the wiring 35, and the other end of the via 44 is connected to the wiring pattern 51. The via 45 is disposed in the opening 65. One end of the via 45 is connected to the wiring 36, and the other end of the via 45 is connected to the wiring pattern 52.

The via 47 is disposed in the opening 66. One end of the via 47 is connected to the wiring 38, and the other end of the via 47 is connected to the wiring pattern 54. The via 48 is disposed in the opening 67. One end of the via 48 is connected to the wiring 39, and the other end of the via 48 is connected to the wiring pattern 55.

The wiring pattern 51 is disposed on an upper surface 41A of the insulating layer 41 of the portion corresponding to a formation position of the via 44. The wiring pattern 51 has a connection part 51A to which a bump 76 disposed in the light emitting element 21 is connected. The wiring pattern 51 is connected to the via 44. The wiring pattern 51 is electrically connected to the wiring 35 through the via 44.

The wiring pattern 52 is disposed on the upper surface 41A of the insulating layer 41 of the portion corresponding to a formation position of the via 45. The wiring pattern 52 has a connection part 52A to which a bump 78 disposed in the light receiving element 22 is connected. The wiring pattern 52 is connected to the via 45. The wiring pattern 52 is electrically connected to the wiring 36 through the via 45.

The wiring pattern 54 is disposed on a lower surface 42A of the insulating layer 42 of the portion corresponding to a formation position of the via 47. The wiring pattern 54 has a connection part 54A connected to a mounting substrate such as a motherboard (not shown). The wiring pattern 54 is connected to the via 47. The wiring pattern 54 is electrically connected to the wiring 38 through the via 47.

The wiring pattern 55 is disposed on the lower surface 42A of the insulating layer 42 of the portion corresponding to a formation position of the via 48. The wiring pattern 55 has a connection part 55A connected to a mounting substrate such as a motherboard (not shown). The wiring pattern 55 is connected to the via 48. The wiring pattern 55 is electrically connected to the wiring 39 through the via 48.

The solder resist 57 is disposed on the upper surface 41A of the insulating layer 41 so as to cover the wiring patterns 51, 52 of the portion excluding the connection parts 51A, 52A. The solder resist 57 has an opening 57A for exposing the connection part 51A and an opening 57B for exposing the connection part 52A.

The solder resist 58 is disposed on the lower surface 42A of the insulating layer 42 so as to cover the wiring patterns 54, 55 of the portion excluding the connection parts 54A, 55A. The solder resist 58 has an opening 58A for exposing the connection part 54A and an opening 58B for exposing the connection part 55A.

The insulating member 12 is disposed on an upper surface 57C of the solder resist 57. The insulating member 12 has an inclined surface 12A on which the mirror 14 is formed. The inclined surface 12A is formed in a smooth surface. An angle $\theta_1$ between the inclined surface 12A and the upper surface 57C of the solder resist 57 is set at an angle capable of reflecting an optical signal from the light emitting element 21 to a core part 72 by the mirror 14. The angle $\theta_1$ can be set at, for example, 45°. As a material of the insulating member 12, for example, an ultraviolet curing resin can be used. As the ultraviolet curing resin, for example, an epoxy resin or an acrylic resin can be used.

The insulating member 13 is disposed on the upper surface 57C of the solder resist 57. The insulating member 13 has an inclined surface 13A on which the mirror 15 is inclined. The inclined surface 13A is arranged as opposed to the inclined surface 12A of the insulating member 12 through the optical waveguide 17. The inclined surface 13A is formed in a smooth surface. An angle $\theta_2$ between the inclined surface 13A and the upper surface 57C of the solder resist 57 is set at an angle capable of reflecting an optical signal transmitted to the core part 72 toward the light receiving element 22 by the mirror 15. The angle $\theta_2$ can be set at, for example, 45°. As a material of the insulating member 13, for example, an ultraviolet curing resin can be used. As the ultraviolet curing resin, for example, an epoxy resin or an acrylic resin can be used.

The mirror 14 is disposed on the smooth inclined surface 12A of the insulating member 12. The mirror 14 is means for reflecting an optical signal emitted from the light emitting element 21 toward the core part 72 of the optical waveguide 17. As the mirror 14, for example, a metal film can be used. As the metal film used as the mirror 14, for example, an Au film can be used. When the Au film is used as the mirror 14, a thickness of the mirror 14 can be set at, for example, 0.2 μm to 1.0 μm.

The mirror 15 is disposed on the smooth inclined surface 13A of the insulating member 13. The mirror 15 is means for reflecting an optical signal so as to direct the optical signal transmitted by the core part 72 of the optical waveguide 17 to a light receiving part 79 of the light receiving element 22. As the mirror 15, for example, a metal film can be used. As the metal film used as the mirror 15, for example, an Au film can be used. When the Au film is used as the mirror 15, a thickness of the mirror 15 can be set at, for example, 0.2 μm to 1.0 μm.

The optical waveguide 17 is arranged on the solder resist 57 located between the mirror 14 and the mirror 15. The optical waveguide 17 has a first cladding layer 71, the core part 72 and a second cladding layer 73.

Figure 7:
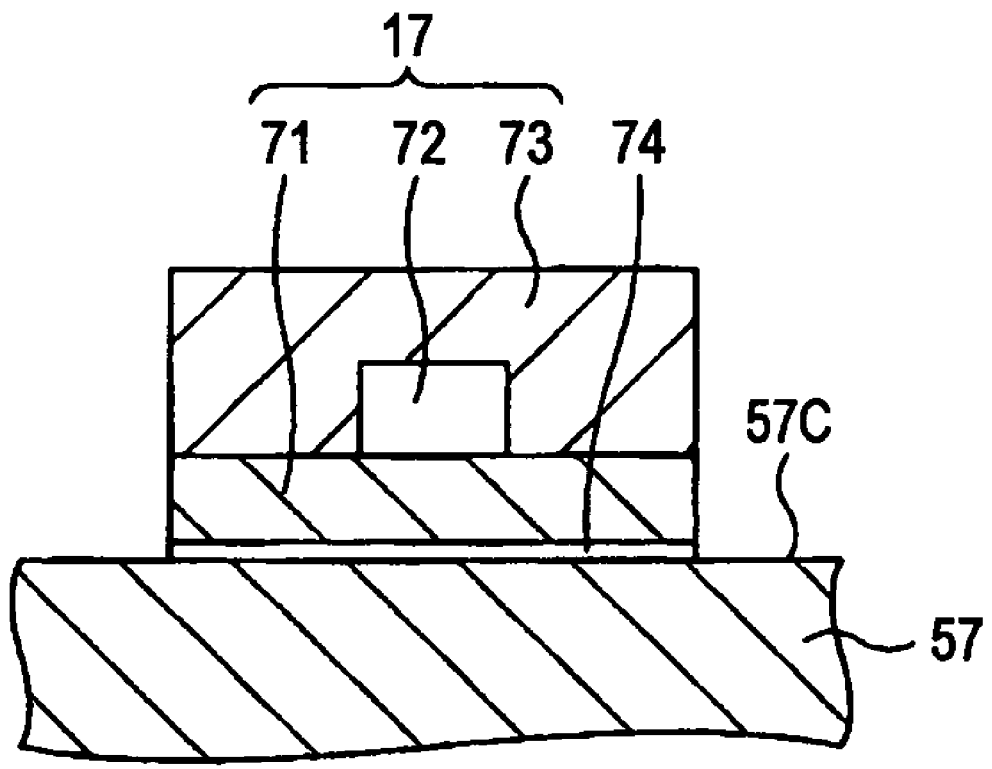
FIG. 7 is a sectional diagram in a direction of line A-A of an optical waveguide shown in FIG. 6.
Figure 8:
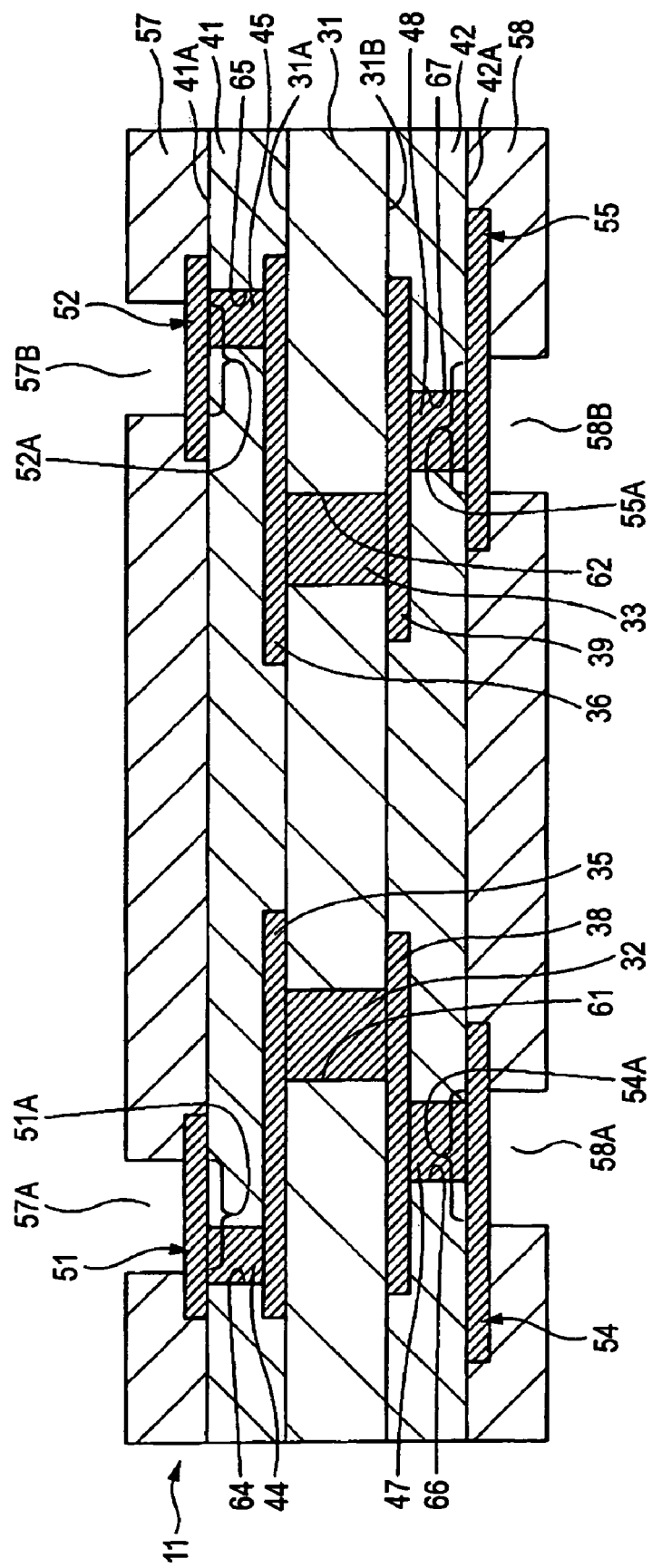
FIG. 8 is a diagram showing a manufacturing step of the optical-electrical substrate according to the first embodiment of the present invention (first).
Figure 9:
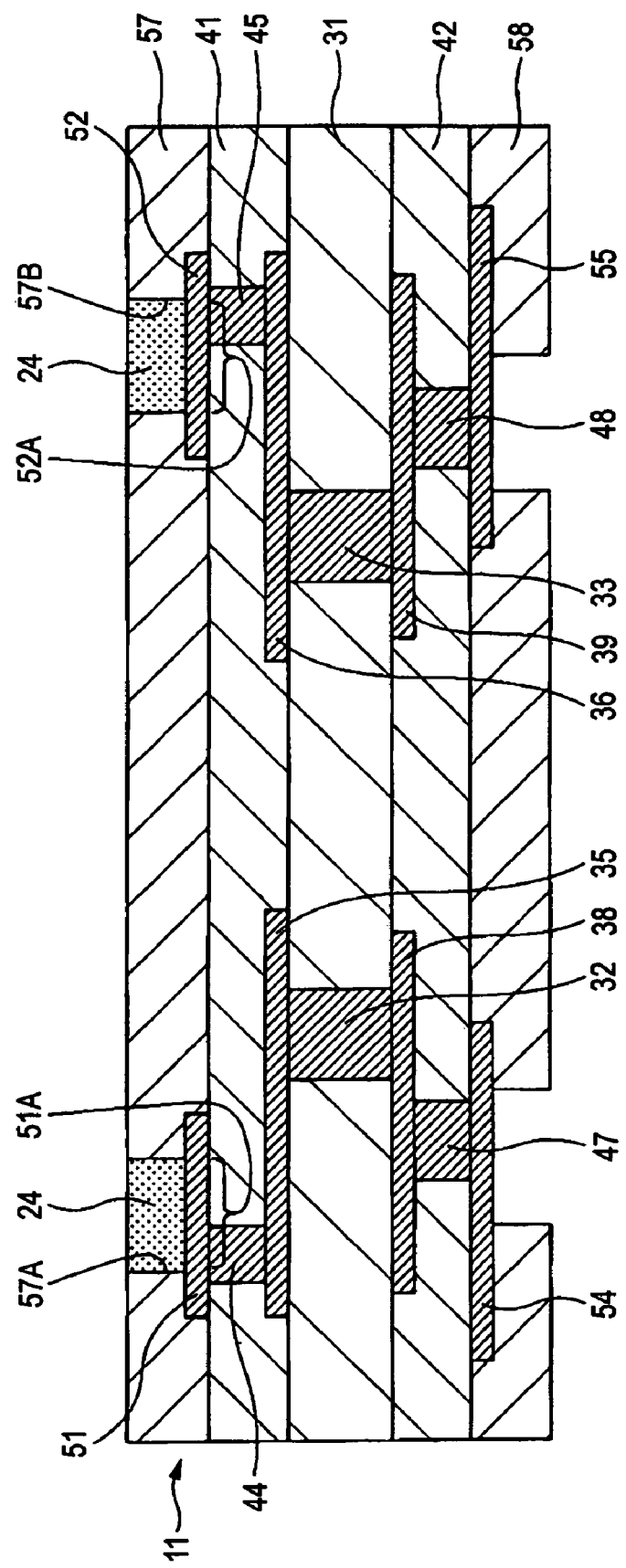
FIG. 9 is a diagram showing a manufacturing step of the optical-electrical substrate according to the first embodiment of the present invention (second).

FIG. 7 is a sectional diagram in a direction of line A-A of the optical waveguide shown in FIG. 6.

Referring to FIGS. 6 and 7, the first cladding layer 71 is bonded to the upper surface 57C of the solder resist 57 by an adhesive 74. The core part 72 is disposed on the first cladding layer 71. The core part 72 is means for transmitting an optical signal. The core part 72 is constructed by a material with a refractive index higher than that of the first cladding layer 71 and the second cladding layer 73. The second cladding layer 73 is disposed on the first cladding layer 71 so as to cover the core part 72.

The light emitting element 21 is disposed over the mirror 14 and the connection part 51A. The light emitting element 21 is connected to the bump 76. The light emitting element 21 is electrically connected to the connection part 51A through the bump 76. The light emitting element 21 has a light emitting part 77 for emitting an optical signal. The light emitting part 77 is arranged in a position capable of irradiating the mirror 14 with the optical signal. As the light emitting element 21, for example, a surface emitting laser element (VCSEL) can be used.

The light receiving element 22 is disposed over the mirror 15 and the connection part 52A. The light receiving element 22 is connected to the bump 78. The light receiving element 22 is electrically connected to the connection part 52A through the bump 78. The light receiving element 22 has a light receiving part 79 for receiving an optical signal transmitted by the core part 72. The light receiving part 79 is arranged in a position capable of receiving the optical signal reflected by the mirror 15. As the light receiving element 22, for example, a photodiode element (PD) can be used.

The solder 24 is disposed on the connection parts 51A, 52A. The solder 24 is means for fixing the bumps 76, 78 to the connection parts 51A, 52A.

The underfill resin 25 is disposed among the light emitting element 21, the wiring substrate 11, the mirror 14 and the optical waveguide 17. The underfill resin 25 is means for tightly fixing the light emitting element 21 to the wiring substrate 11. As the underfill resin 25, for example, an optically transparent resin capable of transmitting an optical signal from the light emitting element 21 is used.

The underfill resin 26 is disposed among the light receiving element 22, the wiring substrate 11, the mirror 15 and the optical waveguide 17. The underfill resin 26 is means for tightly fixing the light receiving element 22 to the wiring substrate 11. As the underfill resin 26, for example, an optically transparent resin capable of transmitting an optical signal transmitted by the core part 72 is used.

Figure 19:
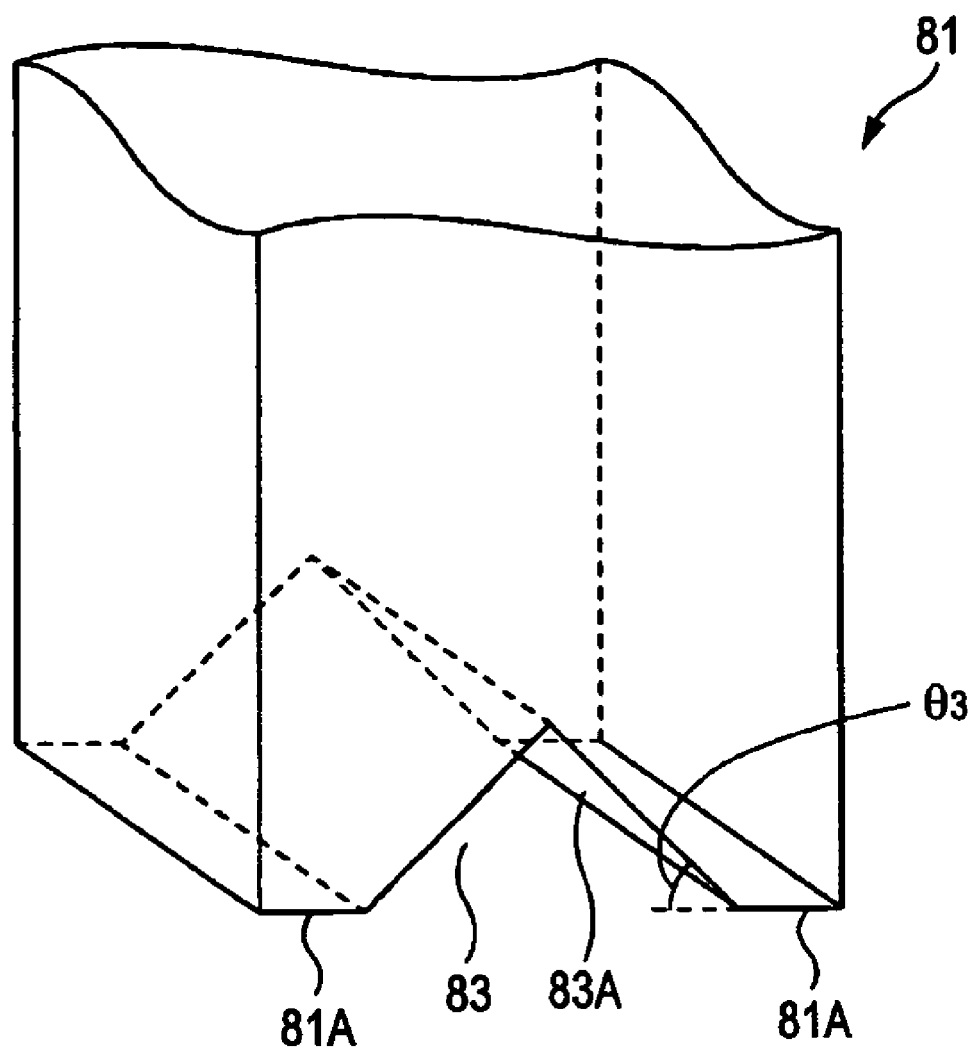
FIG. 19 is a perspective diagram of a mold for insulating member formation.

FIGS. 8 to 18 are diagrams showing manufacturing steps of the optical-electrical substrate according to the first embodiment of the present invention, and FIG. 19 is a perspective diagram of a mold for insulating member formation. In FIGS. 8 to 19, the same numerals are assigned to the same components as those of the optical-electrical substrate 10 of the first embodiment.

A manufacturing method of the optical-electrical substrate 10 of the first embodiment will be described with reference to FIGS. 8 to 19. First, in a step shown in FIG. 8, by a well known technique, a wiring substrate 11 is manufactured. Next, in a step shown in FIG. 9, solder 24 is formed in openings 57A, 57B of a solder resist 57.

Figure 10:
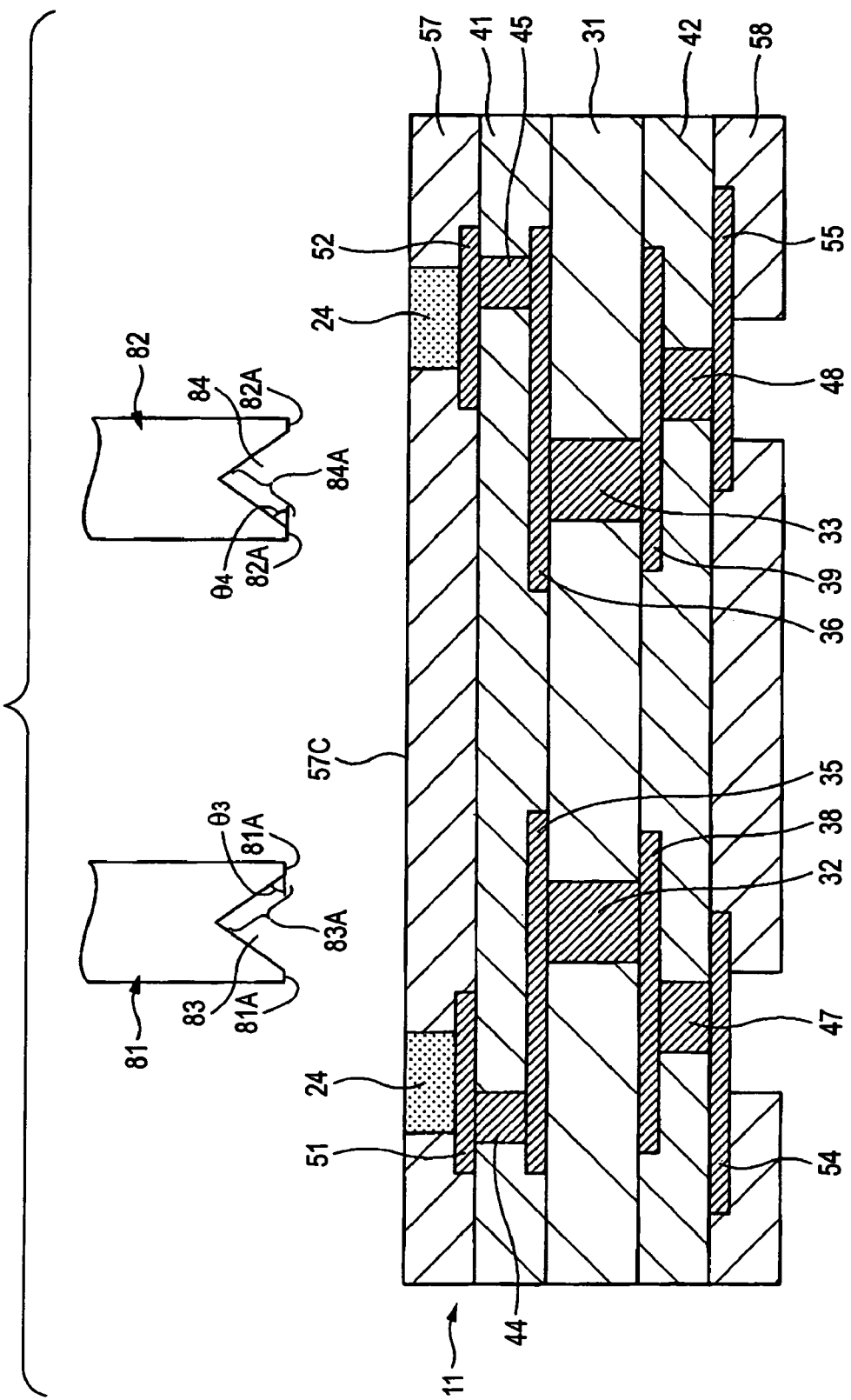
FIG. 10 is a diagram showing a manufacturing step of the optical-electrical substrate according to the first embodiment of the present invention (third).

Then, in a step shown in FIG. 10, a mold 81 for insulating member formation used in the case of forming an insulating member 12 and a mold 82 for insulating member formation used in the case of forming an insulating member 13 are prepared (a preparation step of the molds for insulating member formation).

The molds 81, 82 for insulating member formation will be described herein. Referring to FIGS. 10 and 19, the mold 81 for insulating member formation has a groove part 83 corresponding to a shape of the insulating member 12. The groove part 83 is formed in a V-shaped groove. An angle $\theta_3$ between a bottom surface 81A of the mold 81 for insulating member formation and an inclined surface 83A (a surface for forming an inclined surface 12A of the insulating member 12) of the mold 81 for insulating member formation constructing the groove part 83 is substantially equal to the angle $\theta_1$ of the inclined surface 12A of the insulating member 12. The angle $\theta_3$ can be set at, for example, 45°. Also, the inclined surface 83A is formed in a smooth surface.

Thus, the inclined surface 83A of the mold 81 for insulating member formation for forming the inclined surface 12A of the insulating member 12 is formed in the smooth surface and thereby, the inclined surface 12A of the insulating member 12 can be formed in a smooth surface. Consequently, a reflective surface (a surface for reflecting an optical signal) of a mirror 14 formed on the inclined surface 12A of the insulating member 12 is formed in a smooth surface, so that transmission loss of an optical signal of the mirror 14 can be reduced.

The mold 81 for insulating member formation is constructed by a material capable of transmitting ultraviolet rays. As a material of the mold 81 for insulating member formation, for example, glass can be used.

Referring to FIG. 10, the mold 82 for insulating member formation has a groove part 84 corresponding to a shape of the insulating member 13. The groove part 84 is formed in a V-shaped groove. An angle $\theta_4$ between a bottom surface 82A of the mold 82 for insulating member formation and an inclined surface 84A (a surface for forming an inclined surface 13A of the insulating member 13) of the mold 82 for insulating member formation constructing the groove part 84 is substantially equal to the angle $\theta_2$ of the inclined surface 13A of the insulating member 13. The angle $\theta_4$ can be set at, for example, 45°. Also, the inclined surface 84A is formed in a smooth surface.

Thus, the inclined surface 84A of the mold 82 for insulating member formation for forming the inclined surface 13A of the insulating member 13 is formed in the smooth surface and thereby, the inclined surface 13A of the insulating member 13 can be formed in a smooth surface. Consequently, a reflective surface (a surface for reflecting an optical signal) of a mirror 15 formed on the inclined surface 13A of the insulating member 13 is formed in a smooth surface, so that transmission loss of an optical signal of the mirror 15 can be reduced.

The mold 82 for insulating member formation is formed in a shape similar to that of the mold 81 for insulating member formation shown in FIG. 19. The mold 82 for insulating member formation is constructed by a material capable of transmitting ultraviolet rays. As a material of the mold 82 for insulating member formation, for example, glass can be used.

Figure 11:
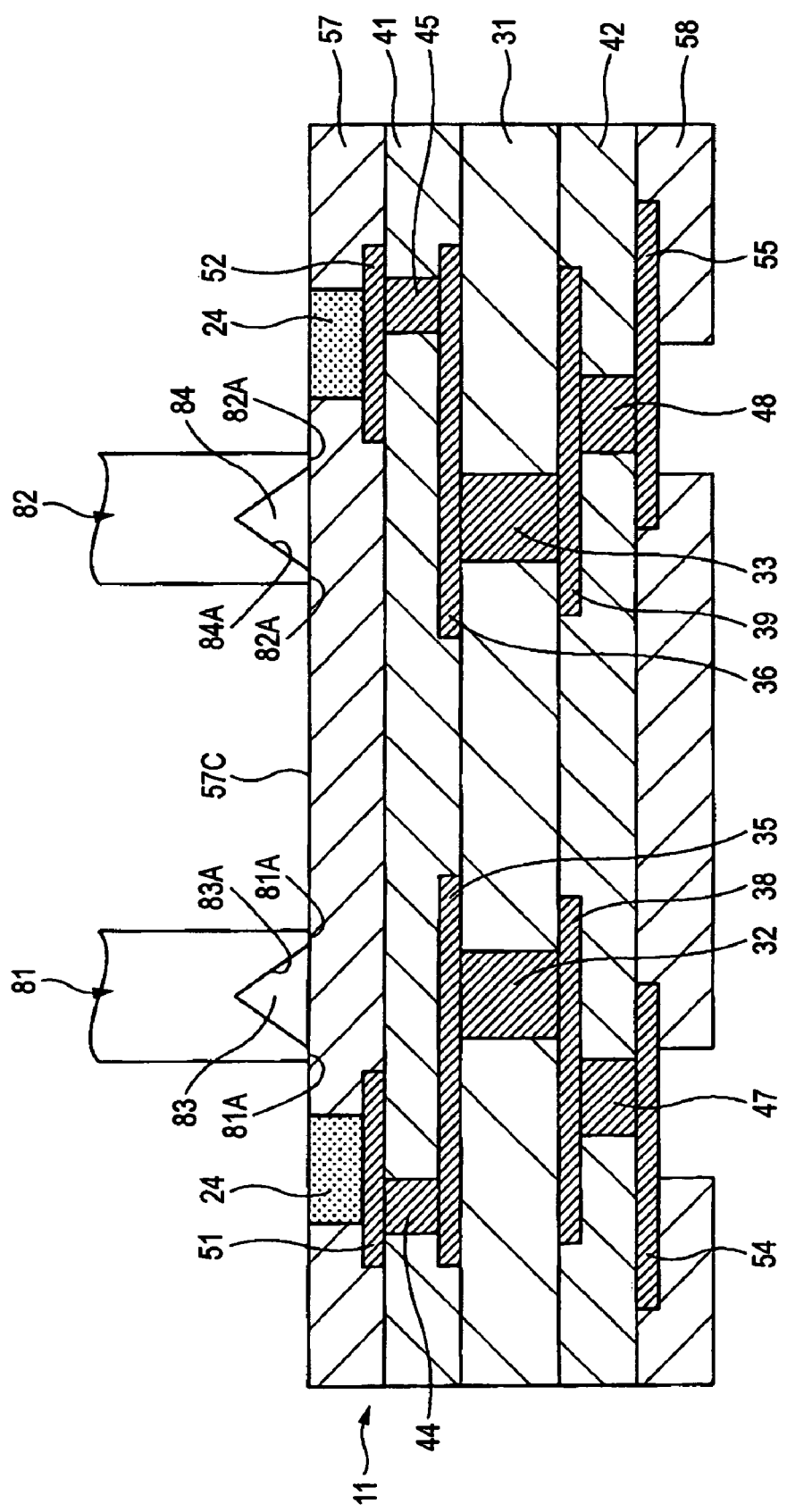
FIG. 11 is a diagram showing a manufacturing step of the optical-electrical substrate according to the first embodiment of the present invention (fourth).

Then, in a step shown in FIG. 11, the bottom surface 81A of the mold 81 for insulating member formation is pressed on an upper surface 57C of the solder resist 57 of the portion corresponding to a formation position of the insulating member 12 and also, the bottom surface 82A of the mold 82 for insulating member formation is pressed on the upper surface 57C of the solder resist 57 of the portion corresponding to a formation position of the insulating member 13.

Figure 12:
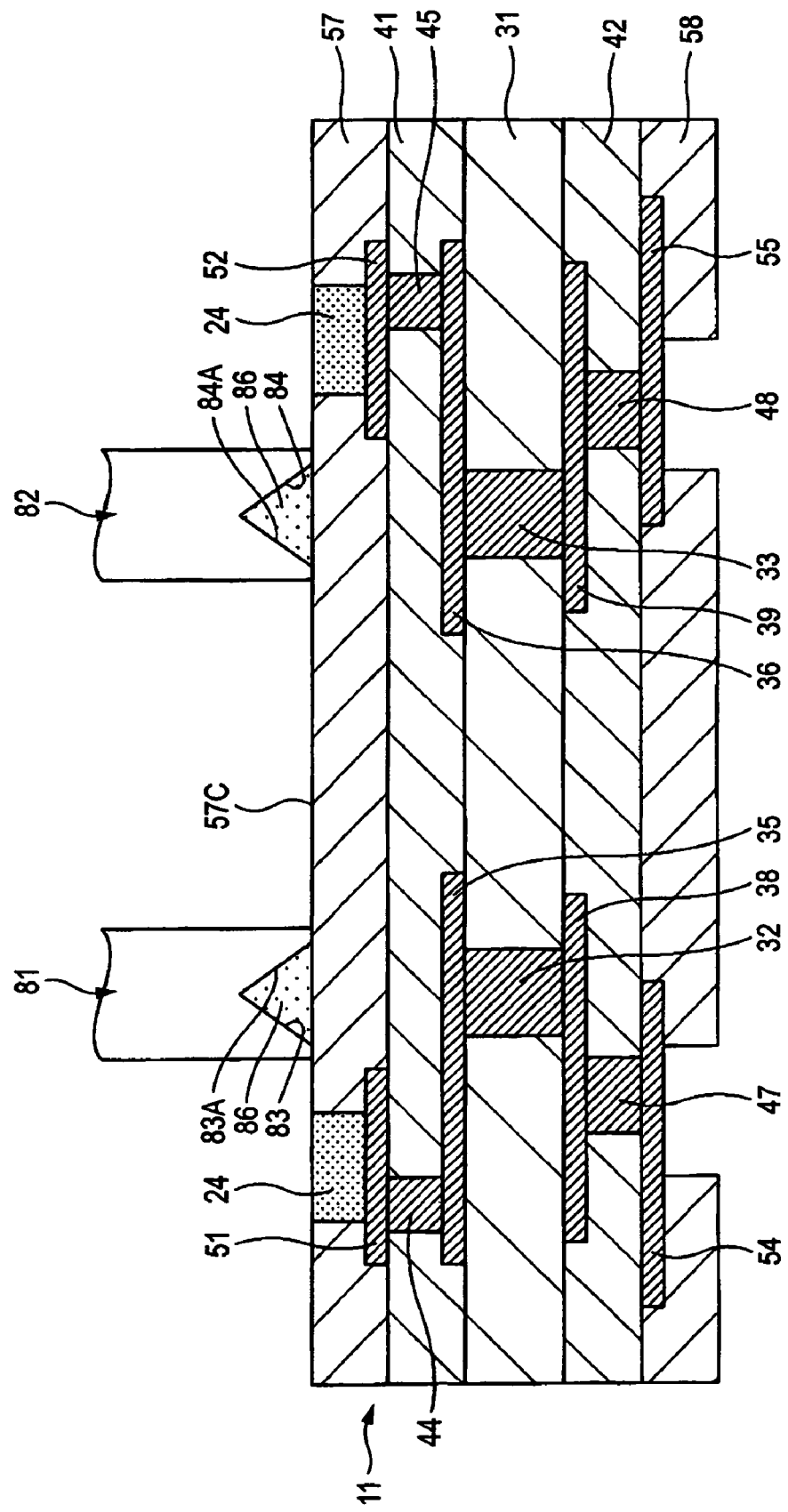
FIG. 12 is a diagram showing a manufacturing step of the optical-electrical substrate according to the first embodiment of the present invention (fifth).

Then, in a step shown in FIG. 12, the groove parts 83, 84 of the molds 81, 82 for insulating member formation are filled with a liquid ultraviolet curing resin 86 (a liquid resin filling step). Concretely, the groove parts 83, 84 of the molds 81, 82 for insulating member formation are filled with the liquid ultraviolet curing resin 86 by a capillary phenomenon. The liquid ultraviolet curing resin 86 results in the insulating members 12, 13 by being cured in a step shown in FIG. 13 described below.

Figure 13:
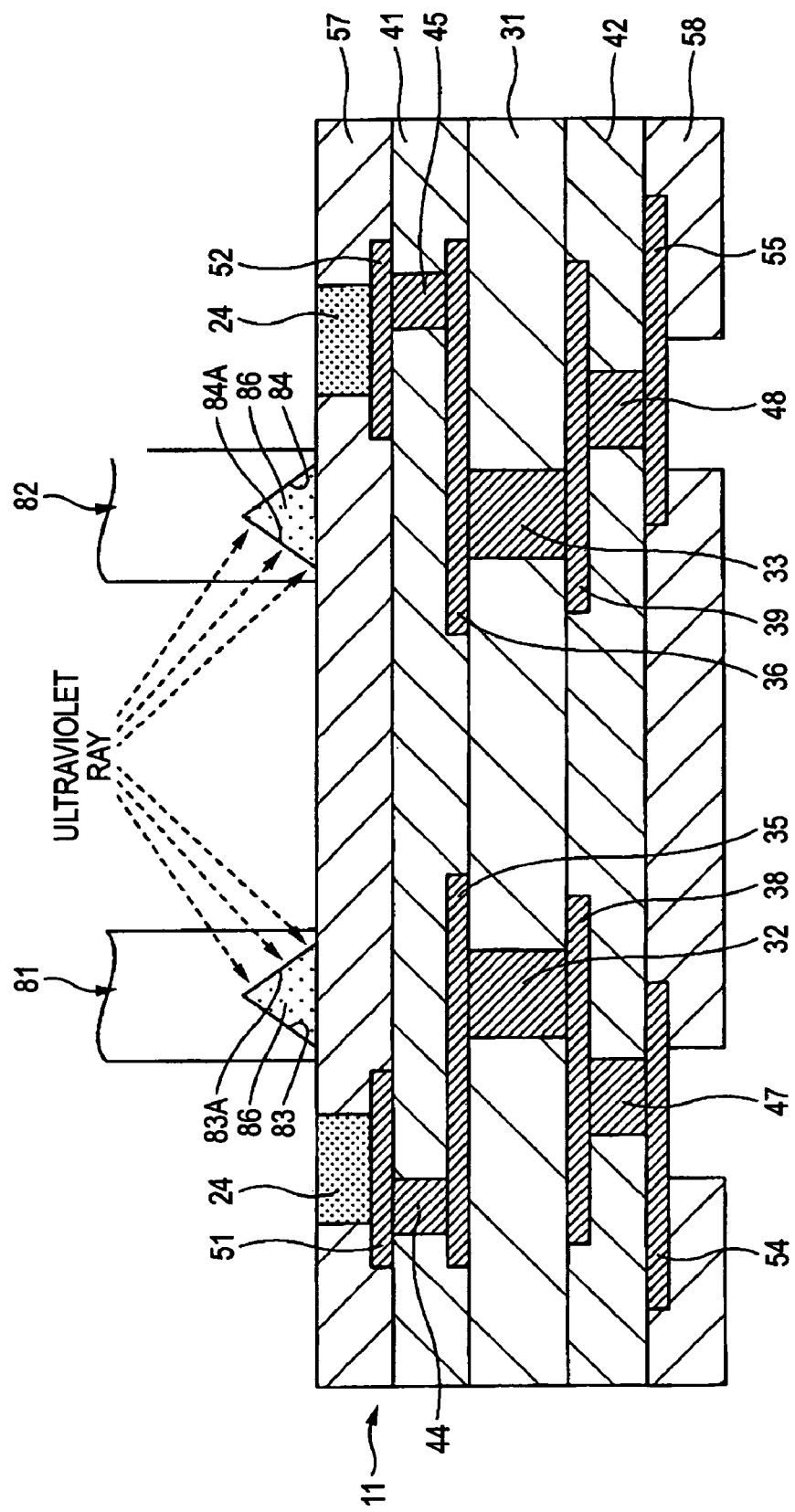
FIG. 13 is a diagram showing a manufacturing step of the optical-electrical substrate according to the first embodiment of the present invention (sixth).

Then, in the step shown in FIG. 13, the liquid ultraviolet curing resin 86 is irradiated with ultraviolet rays through the molds 81, 82 for insulating member formation pressed on the wiring substrate 11 and the liquid ultraviolet curing resin 86 is cured (a resin curing step). Consequently, the insulating member 12 having the smooth inclined surface 12A (a surface on which the mirror 14 is formed) is formed in the groove part 83 of the mold 81 for insulating member formation and also, the insulating member 13 having the smooth inclined surface 13A (a surface on which the mirror 15 is formed) is formed in the groove part 84 of the mold 82 for insulating member formation (see FIG. 14).

By forming the insulating members 12, 13 using the molds 81, 82 for insulating member formation having the groove parts 83, 84 corresponding to shapes of the insulating members 12, 13 thus, the inclined surfaces 12A, 13A on which the mirrors 14, 15 are formed can be formed without using a dicer, so that transmission loss of an optical signal by the mirrors 14, 15 can be reduced as compared with the related-art optical-electrical substrate 200.

Also, by forming the inclined surfaces 83A, 84A of the molds 81, 82 for insulating member formation in smooth surfaces, the inclined surfaces 12A, 13A of the insulating members 12, 13 can be formed in smooth surfaces, so that transmission loss of the optical signal by the mirrors 14, 15 can be reduced further.

Figure 14:
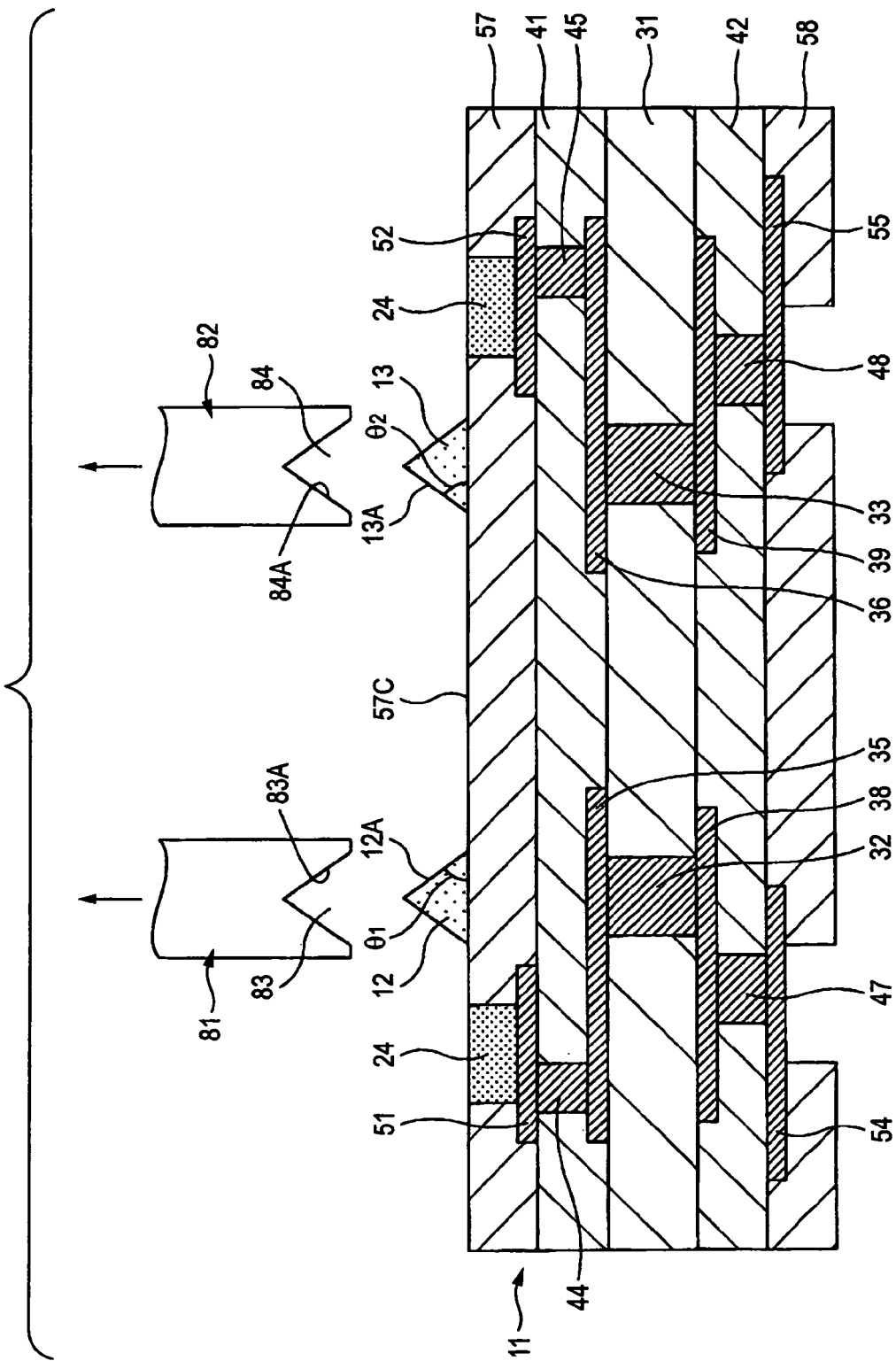
FIG. 14 is a diagram showing a manufacturing step of the optical-electrical substrate according to the first embodiment of the present invention (seventh).

Then, in a step shown in FIG. 14, the molds 81, 82 for insulating member formation are removed from the wiring substrate 11 (a removal step of the molds for insulating member formation).

Figure 15:
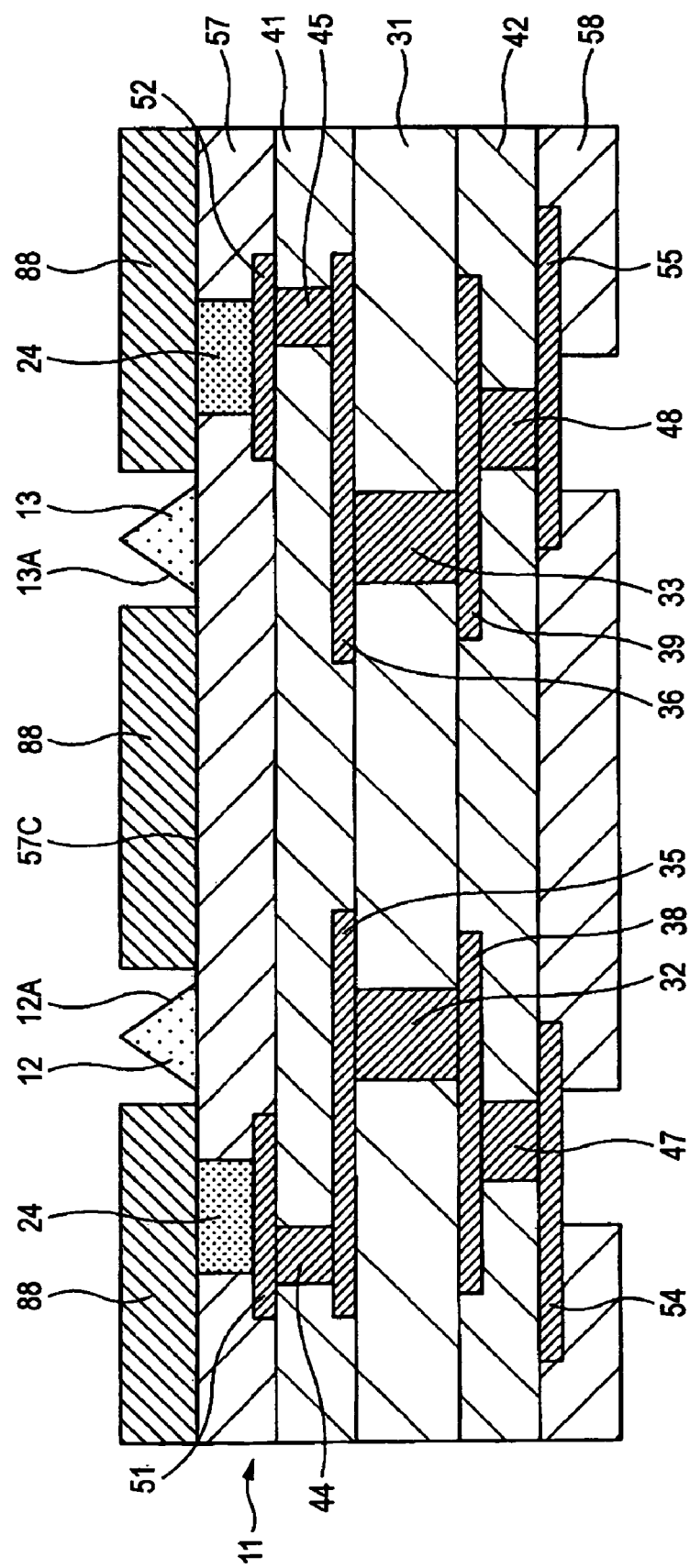
FIG. 15 is a diagram showing a manufacturing step of the optical-electrical substrate according to the first embodiment of the present invention (eighth).

Then, in a step shown in FIG. 15, a resist film 88 having openings for exposing the inclined surfaces 12A, 13A of the insulating members 12, 13 is formed on the solder 24 and the upper surface 57C of the solder resist 57. In addition, the case of forming the resist film 88 so as to expose the whole insulating members 12, 13 is illustrated in FIG. 15, but the resist film 88 may be disposed so as to expose only the inclined surfaces 12A, 13A of the insulating members 12, 13.

Figure 16:
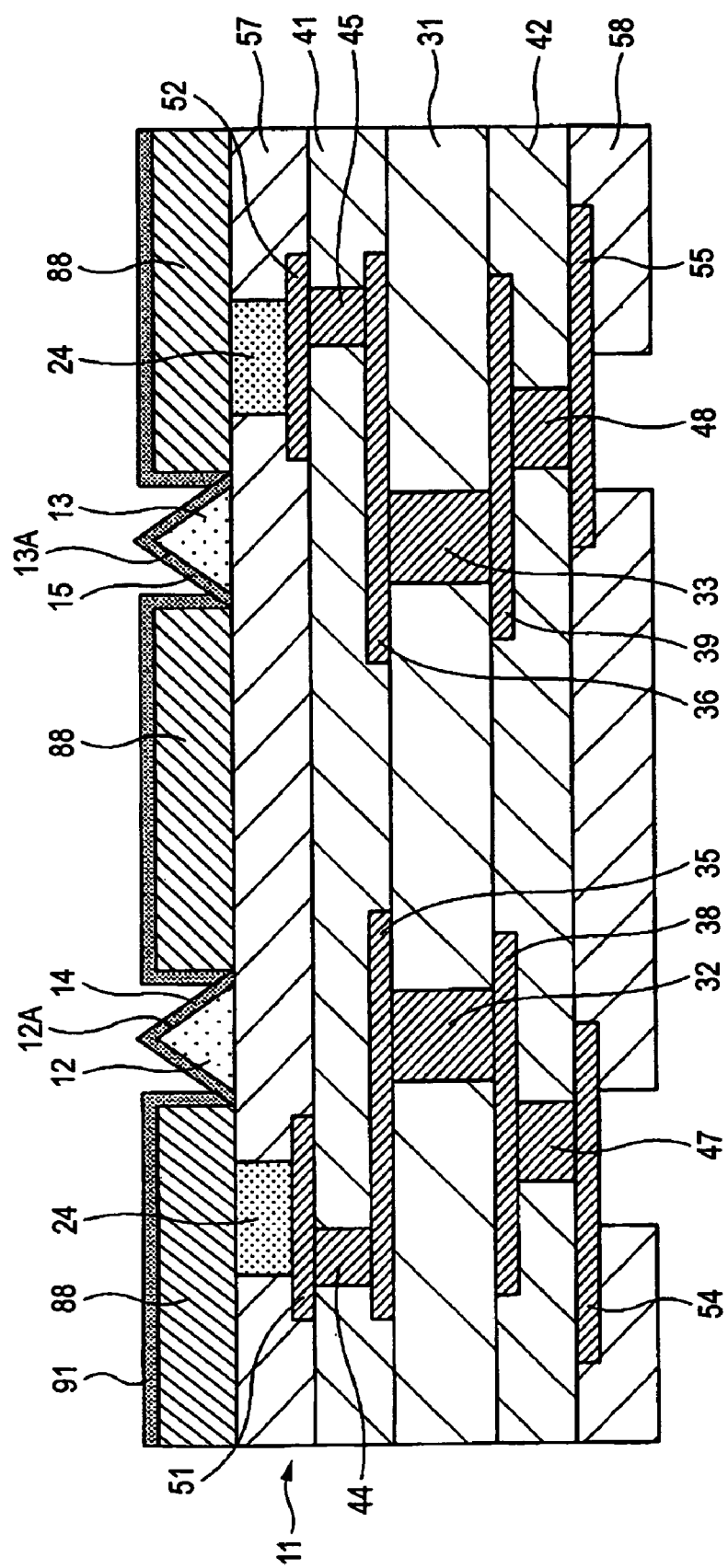
FIG. 16 is a diagram showing a manufacturing step of the optical-electrical substrate according to the first embodiment of the present invention (ninth).

Then, in a step shown in FIG. 16, by a sputtering method or a vacuum evaporation method, a metal film 91 is formed on the inclined surfaces 12A, 13A of the insulating members 12, 13 and the mirrors 14, 15 are formed (a mirror formation step). In this case, the metal film 91 is also formed on side surfaces and an upper surface of the resist film 88. As the metal film 91, for example, an Au film can be used. Also, when the Au film is used as the metal film 91, a thickness of the metal film 91 can be set at, for example, 0.2 μm to 1.0 μm.

By forming the mirrors 14, 15 by forming the metal film 91 on the inclined surfaces 12A, 13A formed in smooth surfaces thus, reflective surfaces (surfaces of the mirrors 14, 15 for reflecting an optical signal) of the mirrors 14, 15 are formed in smooth surfaces, so that transmission loss of the optical signal by the mirrors 14, 15 can be reduced.

Figure 17:
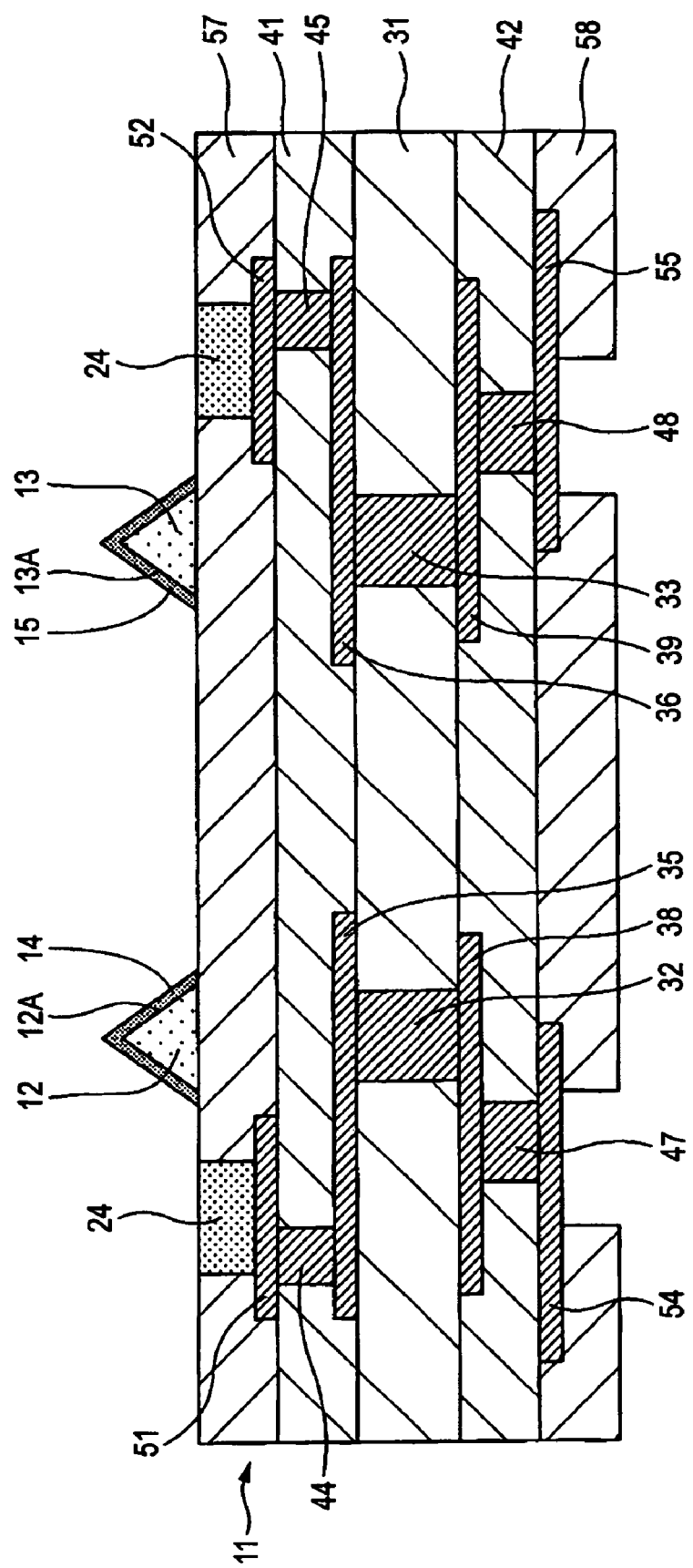
FIG. 17 is a diagram showing a manufacturing step of the optical-electrical substrate according to the first embodiment of the present invention (tenth).
Figure 18:
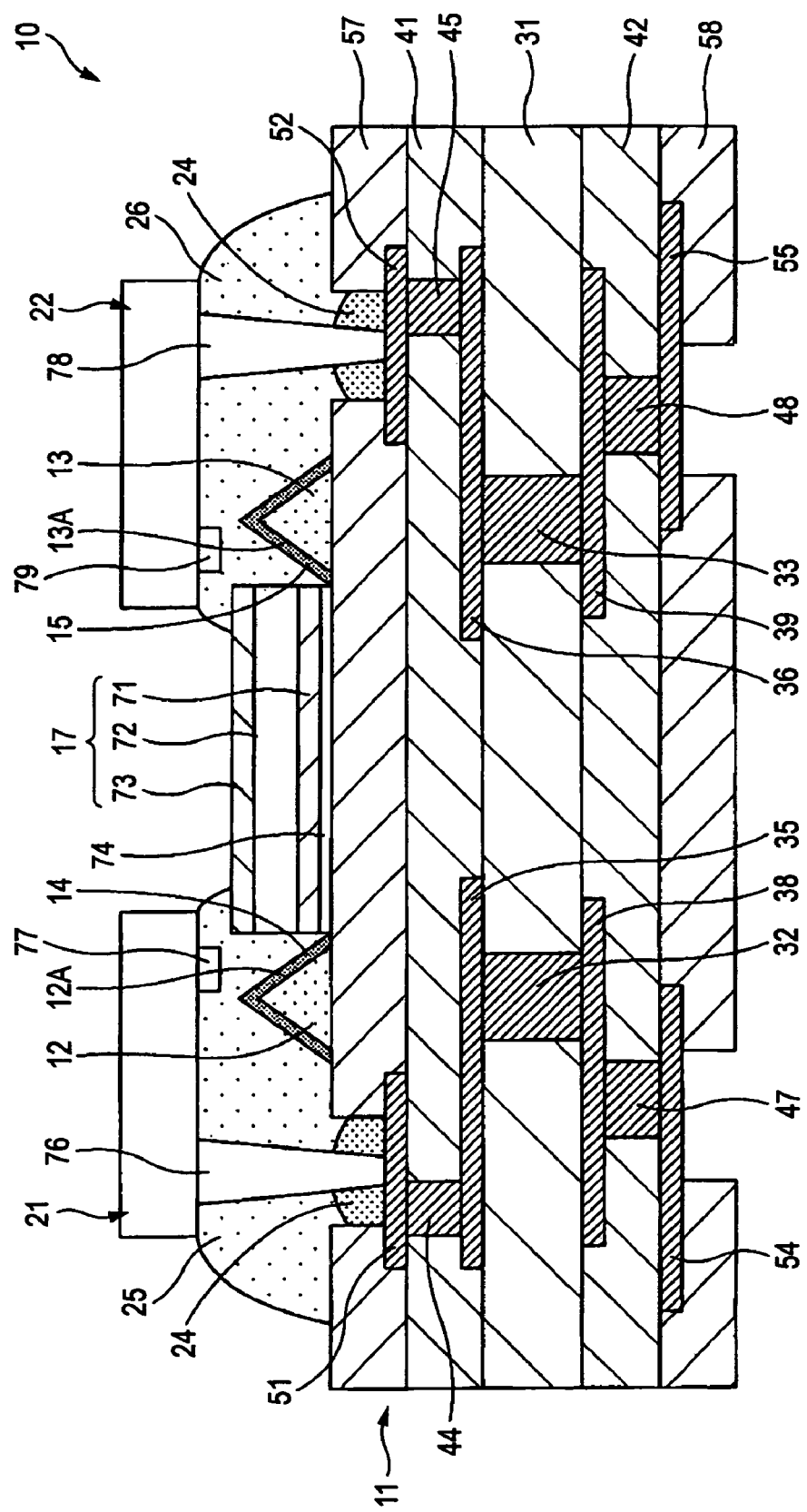
FIG. 18 is a diagram showing a manufacturing step of the optical-electrical substrate according to the first embodiment of the present invention (eleventh).

Then, in a step shown in FIG. 17, the resist film 88 shown in FIG. 16 is removed. Then, in a step shown in FIG. 18, an optical waveguide 17 separately made is bonded on the solder resist 57 located between the mirrors 14, 15 by an adhesive 74 and then, a light emitting element 21 and a light receiving element 22 are mounted on the wiring substrate 11 and thereafter, underfill resins 25, 26 are formed. Consequently, the optical-electrical substrate 10 is manufactured.

According to the manufacturing method of the optical-electrical substrate of the embodiment, after the molds 81, 82 for insulating member formation having the groove parts 83, 84 corresponding to shapes of the insulating members 12, 13 and also transmitting ultraviolet rays are pressed on the wiring substrate 11, the groove parts 83, 84 are filled with the liquid ultraviolet curing resin 86 and then, the liquid ultraviolet curing resin 86 is irradiated with ultraviolet rays through the molds 81, 82 for insulating member formation pressed on the wiring substrate 11 and the liquid ultraviolet curing resin 86 is cured and the insulating members 12, 13 having the smooth inclined surfaces 12A, 13A are formed and thereafter, the metal film 91 are formed on the smooth inclined surfaces 12A, 13A and the mirrors 14, 15 are formed and thereby, reflective surfaces (surfaces of the mirrors 14, 15 for reflecting an optical signal) of the mirrors 14, 15 are formed in smooth surfaces, so that transmission loss of the optical signal by the mirrors 14, can be reduced.

Second Embodiment

Figure 20:
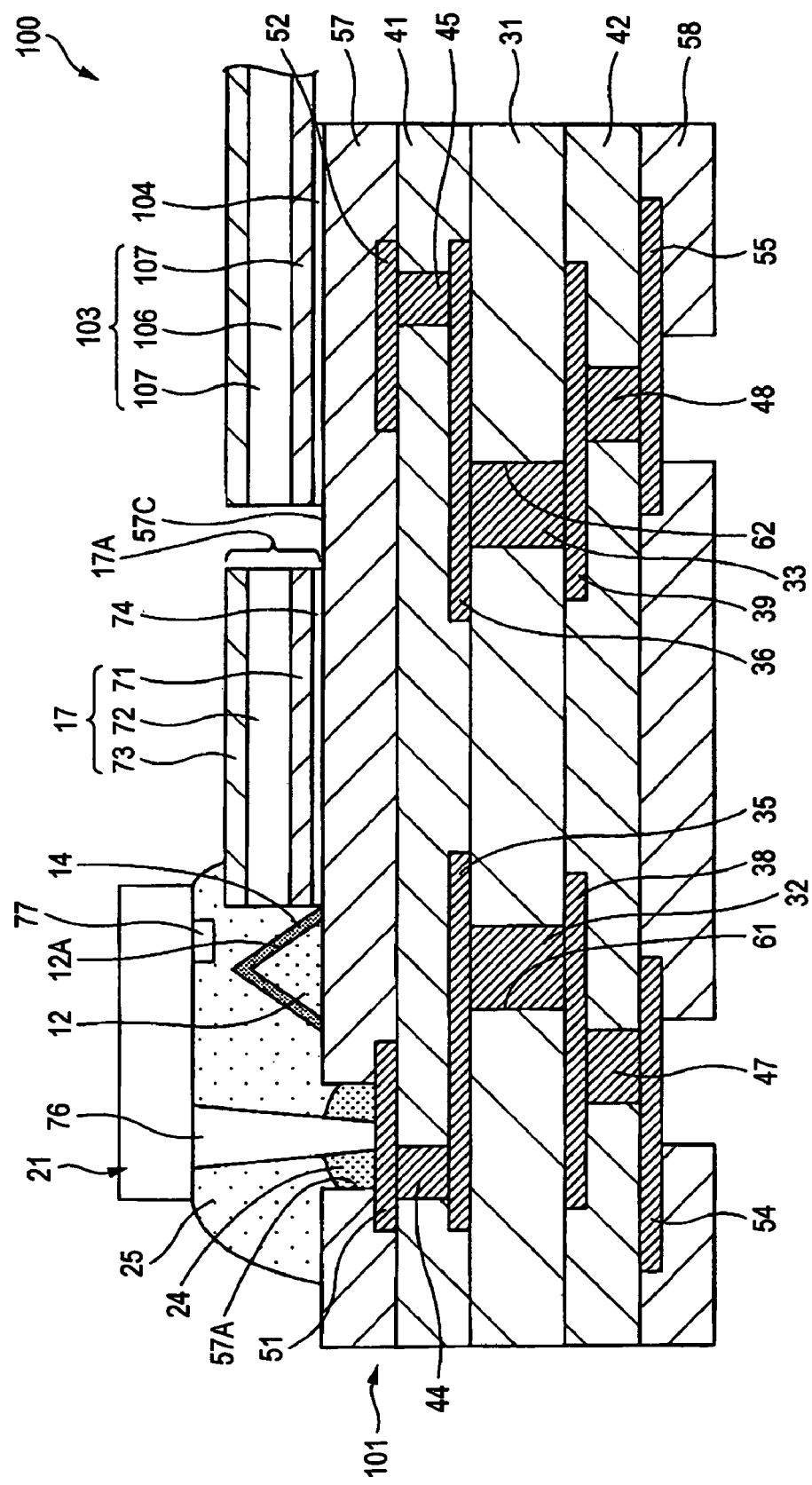
FIG. 20 is a sectional diagram of a optical-electrical substrate according to a second embodiment of the present invention.

FIG. 20 is a sectional diagram of an optical-electrical substrate according to a second embodiment of the present invention. In FIG. 20, the same numerals are assigned to the same components as those of the optical-electrical substrate 10 of the first embodiment.

Referring to FIG. 20, an optical-electrical substrate 100 of the second embodiment has an insulating member 12, a mirror 14, an optical waveguide 17, a light emitting element 21, solder 24, an underfill resin 25, a wiring substrate 101, and an optical fiber 103.

The wiring substrate 101 is constructed in a manner similar to the wiring substrate 11 except that there are no solder 24 arranged in the opening 57B and no opening 57B disposed in the solder resist 57 of the wiring substrate 11 described in the first embodiment.

The optical fiber 103 has a core part 106 for transmitting an optical signal, and a cladding layer 107 for covering the periphery of the core part. The optical fiber 103 is fixed on an upper surface 57C of a solder resist 57 by an adhesive 104. The optical fiber 103 is arranged so that an end face of the core part 106 is opposed to a core part 72 located in an end face 17A of the optical waveguide 17 (an end face of the optical waveguide 17 of the side which is not opposed to the mirror 14).

The optical-electrical substrate 100 of the second embodiment constructed thus can be manufactured by a technique similar to that of the optical-electrical substrate 10 of the first embodiment, and an effect similar to that of the first embodiment can be obtained.

Third Embodiment

Figure 21:
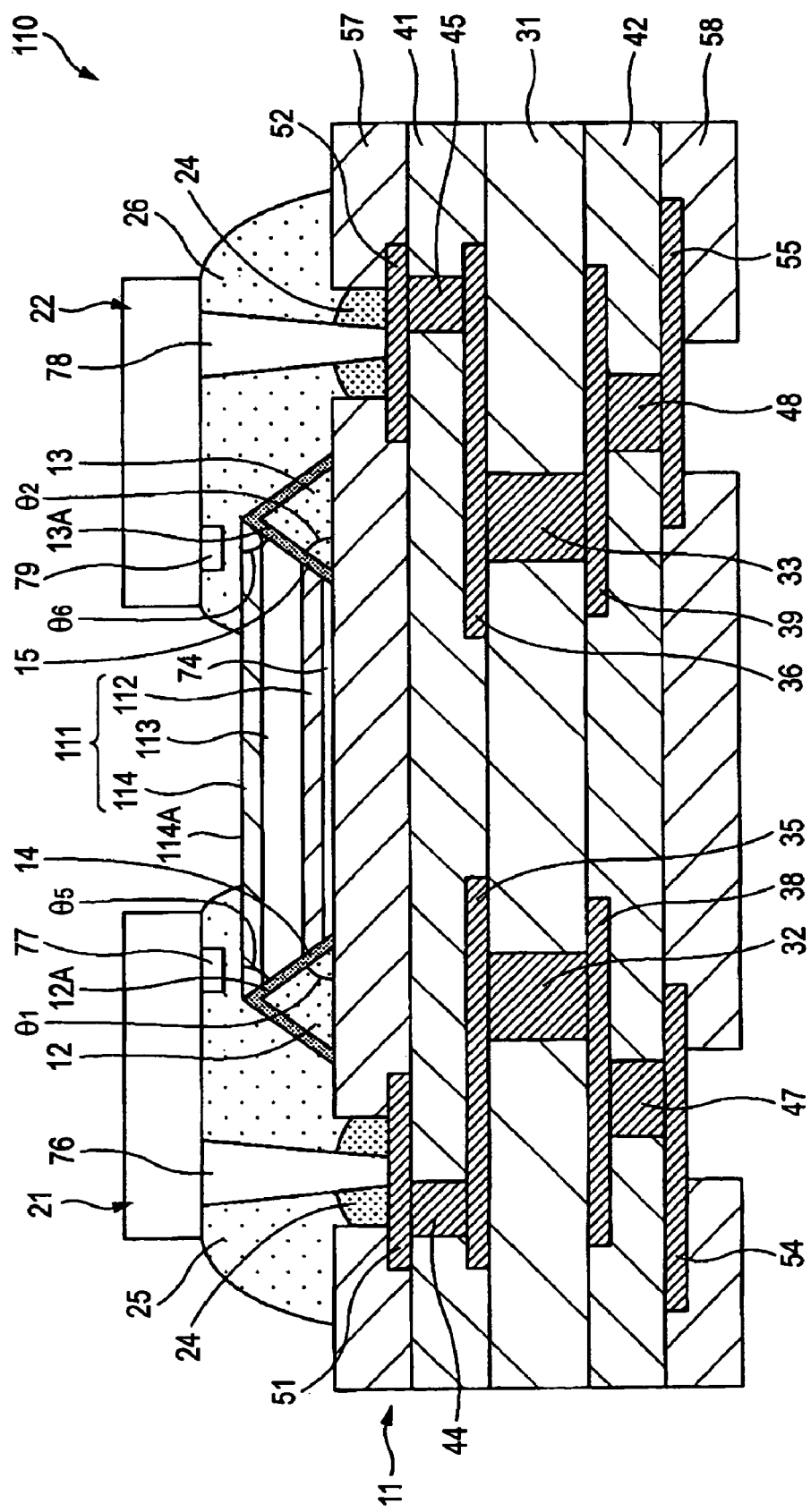
FIG. 21 is a sectional diagram of an optical-electrical substrate according to a third embodiment of the present invention.

FIG. 21 is a sectional diagram of an optical-electrical substrate according to a third embodiment of the present invention. In FIG. 21, the same numerals are assigned to the same components as those of the optical-electrical substrate 10 of the first embodiment.

Referring to FIG. 21, an optical-electrical substrate 110 of the third embodiment is constructed in a manner similar to the optical-electrical substrate 10 except that an optical waveguide 111 is disposed instead of the optical waveguide 17 disposed in the optical-electrical substrate 10 of the first embodiment.

The optical waveguide 111 has a first cladding layer 112, a core part 113 disposed on the first cladding layer 112, and a second cladding layer 114 disposed on the first cladding layer 112 so as to cover the core part 113. The optical waveguide 111 is bonded on a solder resist 57 of the portion located between mirrors 14, 15 by an adhesive 74.

In the optical waveguide 111, two end faces opposed to the mirrors 14, 15 are formed in inclined surfaces. One inclined surface of the optical waveguide 111 is in contact with the mirror 14, and the other inclined surface of the optical waveguide 111 is in contact with the mirror 15. Angles $\theta_5$, $\theta_6$ between the two inclined surfaces of the optical waveguide 111 and an upper surface 114A of the second cladding layer 114 are substantially equal to angles $\theta_1$, $\theta_2$ of inclined surfaces 12A, 13A of insulating members 12, 13. When the angles $\theta_1$, $\theta_2$ are 45°, the angles $\theta_5$, $\theta_6$ can be set at, for example, 45°.

The optical-electrical substrate 110 of the third embodiment constructed thus can be manufactured by a technique similar to that of the optical-electrical substrate 10 of the first embodiment, and an effect similar to that of the first embodiment can be obtained.

Fourth Embodiment

Figure 22:
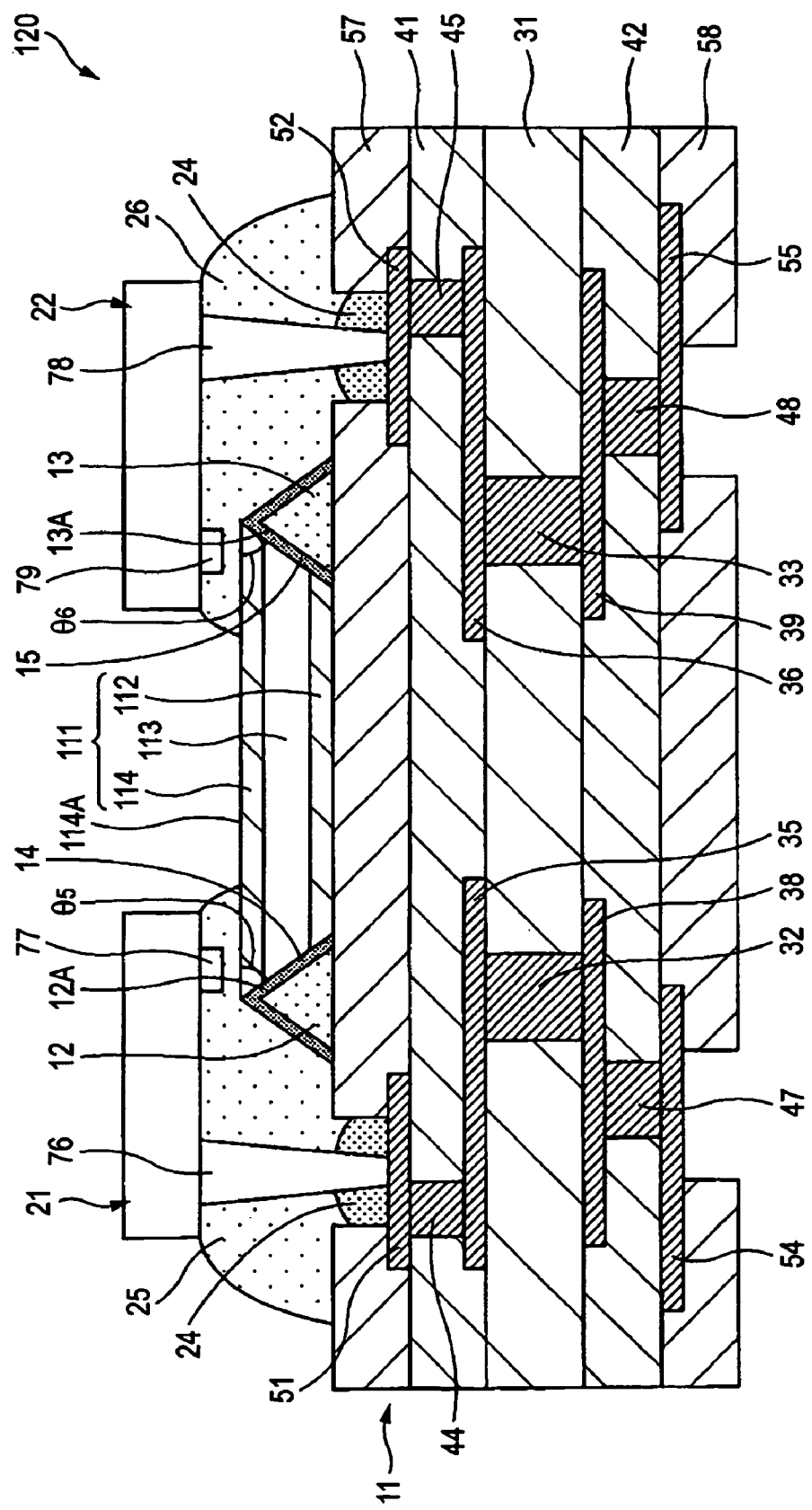
FIG. 22 is a sectional diagram of an optical-electrical substrate according to a fourth embodiment of the present invention.

FIG. 22 is a sectional diagram of an optical-electrical substrate according to a fourth embodiment of the present invention. In FIG. 22, the same numerals are assigned to the same components as those of the optical-electrical substrate 110 of the third embodiment.

Referring to FIG. 22, an optical-electrical substrate 120 of the fourth embodiment is constructed in a manner similar to the optical-electrical substrate 110 of the third embodiment except that an optical waveguide 111 is directly formed on a solder resist 57 of a wiring substrate 11. The optical waveguide 111 disposed in the optical-electrical substrate 120 is formed by sequentially laminating a first cladding layer 112, a core part 113 and a second cladding layer 114 on the solder resist 57 of, that is, the structure body shown in FIG. 17 described in the first embodiment after mirrors 14, 15 are formed.

By directly forming the optical waveguide 111 on the wiring substrate 11 on which the mirrors 14, 15 are formed thus, it becomes unnecessary to bond the optical waveguide 111 on the wiring substrate 11 by an adhesive 74, so that manufacturing cost of the optical-electrical substrate 120 can be reduced.

Fifth Embodiment

Figure 23:
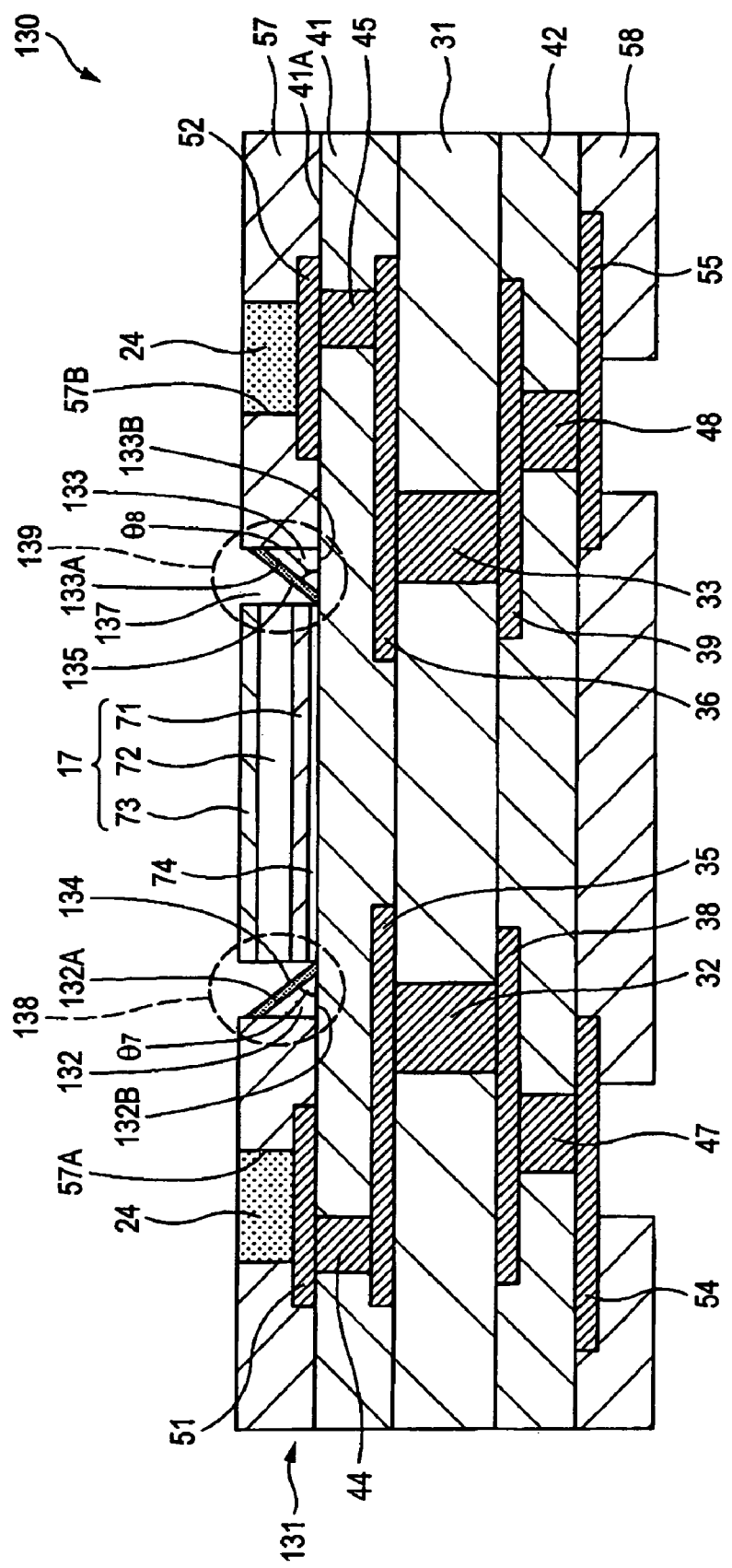
FIG. 23 is a sectional diagram of an optical-electrical substrate according to a fifth embodiment of the present invention.

FIG. 23 is a sectional diagram of an optical-electrical substrate according to a fifth embodiment of the present invention. In FIG. 23, the same numerals are assigned to the same components as those of the optical-electrical substrate of the first embodiment.

Referring to FIG. 23, an optical-electrical substrate 130 of the fifth embodiment has a wiring substrate 131, insulating members 132, 133, mirrors 134, 135, and an optical waveguide 17.

Figure 24:
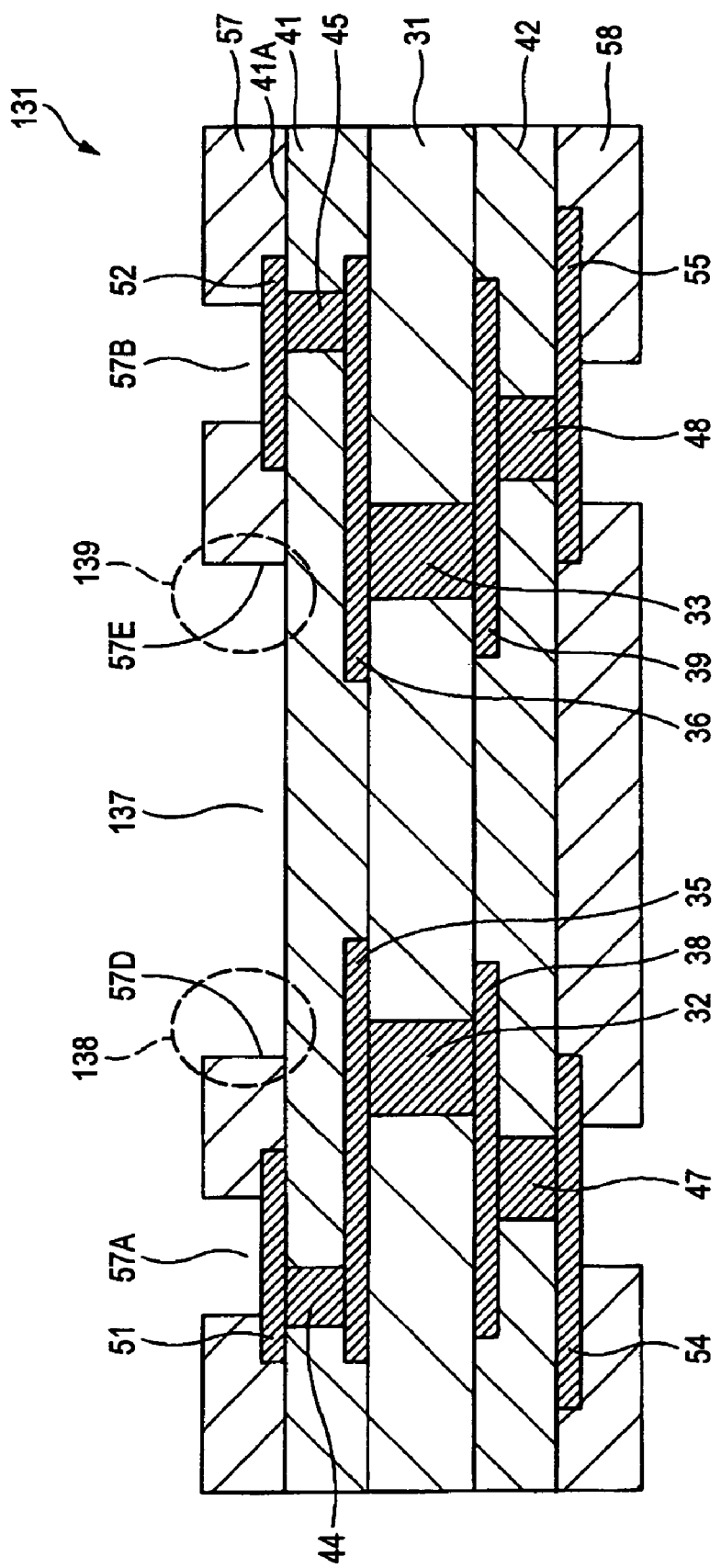
FIG. 24 is a sectional diagram of a wiring substrate shown in FIG. 23.
Figure 25:
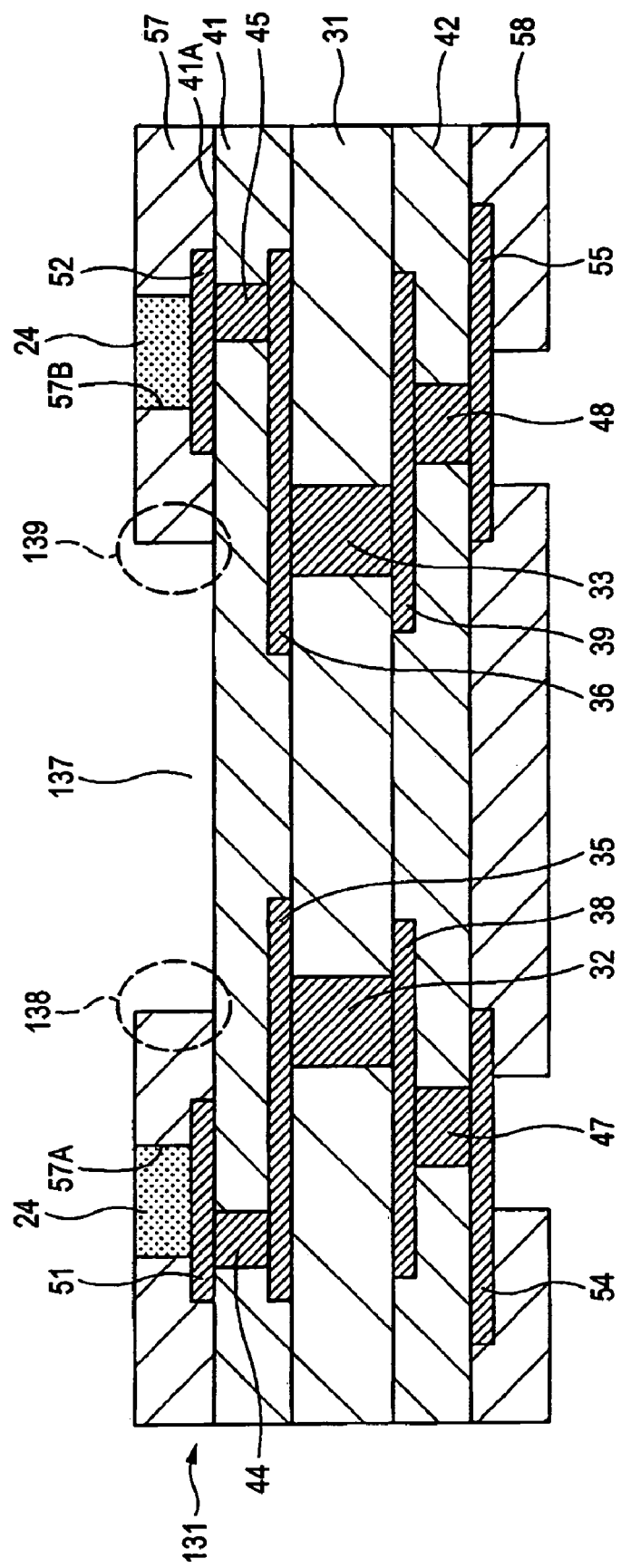
FIG. 25 is a diagram showing a manufacturing step of the optical-electrical substrate according to the fifth embodiment of the present invention (first).

FIG. 24 is a sectional diagram of the wiring substrate shown in FIG. 23.

Referring to FIG. 24, the wiring substrate 131 is constructed in a manner similar to the wiring substrate 11 except that an opening 137 is further disposed in a solder resist 57 disposed in the wiring substrate 11 of the first embodiment. The opening 137 is formed so as to expose an upper surface of an insulating layer 41. By disposing such an opening 137 in the solder resist 57, step parts 138, 139 are formed between an upper surface of the solder resist 57 and the upper surface 41A of the insulating layer 41. The step part 139 is formed as opposed to the step part 138.

Referring to FIG. 23, the insulating member 132 is disposed on the step part 138. The insulating member 132 has an inclined surface 132A on which the mirror 134 is formed. The inclined surface 132A is formed in a smooth surface. An angle $\theta_7$ between the inclined surface 132A and a bottom surface 132B of the insulating member 132 can be set at, for example, 45°. As a material of the insulating member 132, for example, an ultraviolet curing resin can be used. As the ultraviolet curing resin, for example, an epoxy resin or an acrylic resin can be used.

The insulating member 133 is disposed on the step part 139. The insulating member 133 has an inclined surface 133A on which the mirror 135 is formed. The inclined surface 133A is formed in a smooth surface. An angle $\theta_8$ between the inclined surface 133A and a bottom surface 133B of the insulating member 133 can be set at, for example, 45°. As a material of the insulating member 133, for example, an ultraviolet curing resin can be used. As the ultraviolet curing resin used as the material of the insulating member 133, for example, an epoxy resin or an acrylic resin can be used.

The mirror 134 is formed on the smooth inclined surface 132A of the insulating member 132. The mirror 134 is means for reflecting an optical signal toward a core part 72 of the optical waveguide 17. As the mirror 134, for example, a metal film can be used. As the metal film, for example, an Au film can be used. When the Au film is used as the mirror 134, a thickness of the mirror 134 can be set at, for example, 0.2 μm to 1.0 μm.

The mirror 135 is formed on the smooth inclined surface 133A of the insulating member 133. The mirror 135 is means for reflecting an optical signal transmitted by the core part 72 of the optical waveguide 17 in a predetermined direction. As the mirror 135, for example, a metal film can be used. As the metal film, for example, an Au film can be used. When the Au film is used as the mirror 135, a thickness of the mirror 135 can be set at, for example, 0.2 μm to 1.0 μm.

The optical waveguide 17 is bonded on the insulating layer 41 located between the mirrors 134, 135 by an adhesive 74. The core part 72 located in one end face of the optical waveguide 17 is opposed to the mirror 134, and the core part 72 located in the other end face of the optical waveguide 17 is opposed to the mirror 135.

Figure 35:
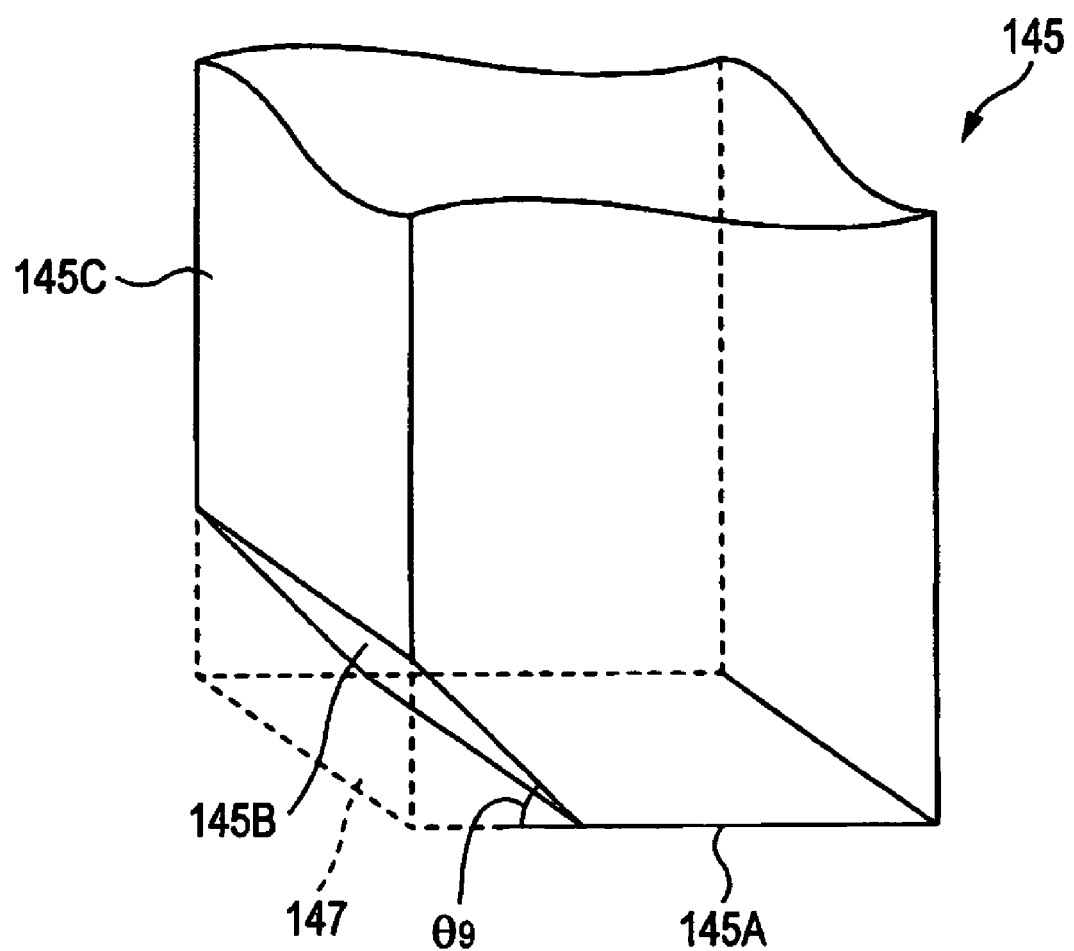
FIG. 35 is a perspective diagram of a mold for insulating member formation.

FIGS. 25 to 34 are diagrams showing manufacturing steps of the optical-electrical substrate according to the fifth embodiment of the present invention, and FIG. 35 is a perspective diagram of a mold for insulating member formation. In FIGS. 25 to 34, the same numerals are assigned to the same components as those of the optical-electrical substrate 130 of the fifth embodiment.

A manufacturing method of the optical-electrical substrate 130 of the fifth embodiment will be described with reference to FIGS. 25 to 35. First, in a step shown in FIG. 25, by a well known technique, a wiring substrate 131 is manufactured and thereafter, solder 24 is formed in openings 57A, 57B of a solder resist 57.

Figure 26:
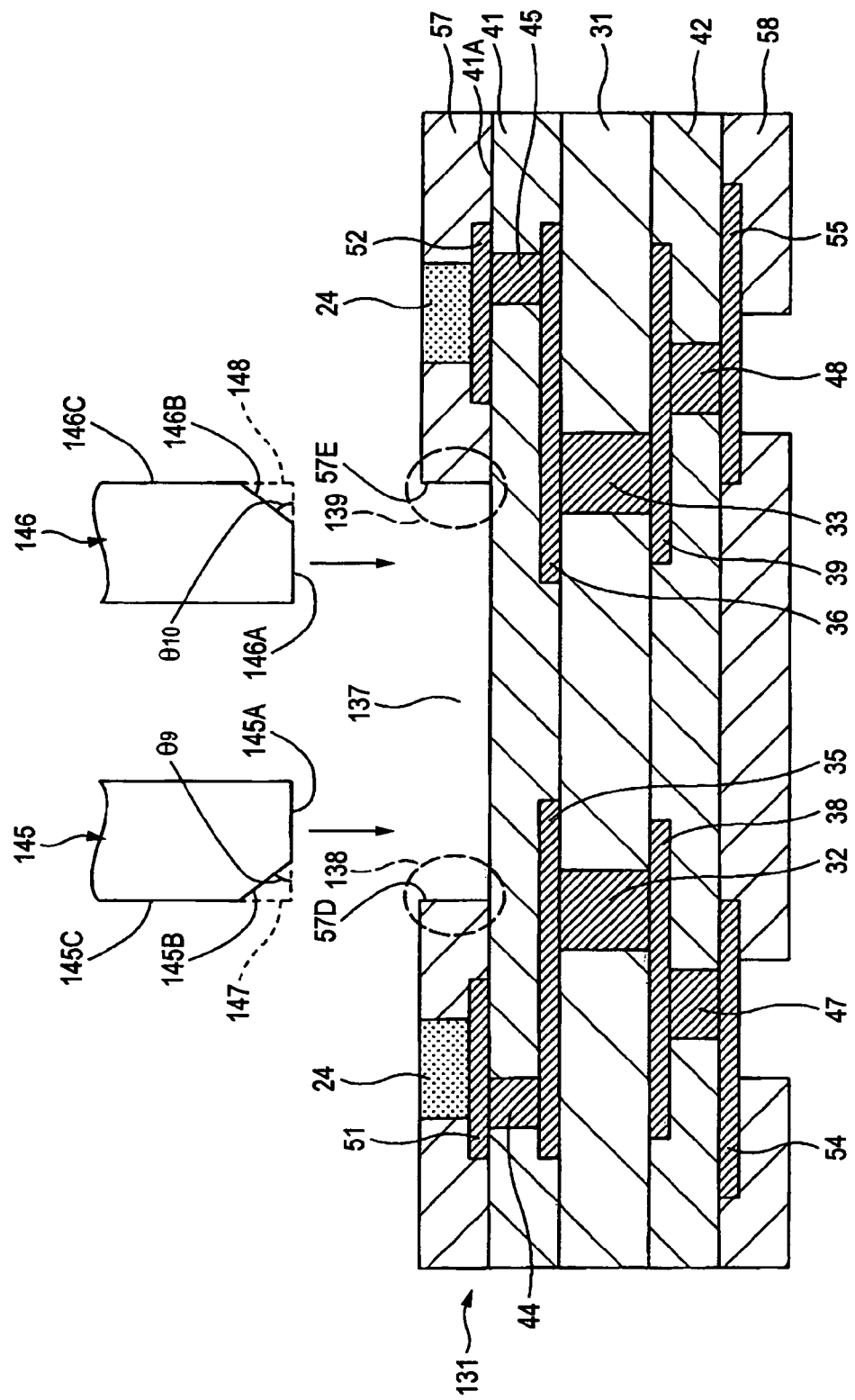
FIG. 26 is a diagram showing a manufacturing step of the optical-electrical substrate according to the fifth embodiment of the present invention (second).

Then, in a step shown in FIG. 26, a mold 145 for insulating member formation used in the case of forming an insulating member 132 and a mold 146 for insulating member formation used in the case of forming an insulating member 133 are prepared (a preparation step of the molds for insulating member formation).

Figure 33:
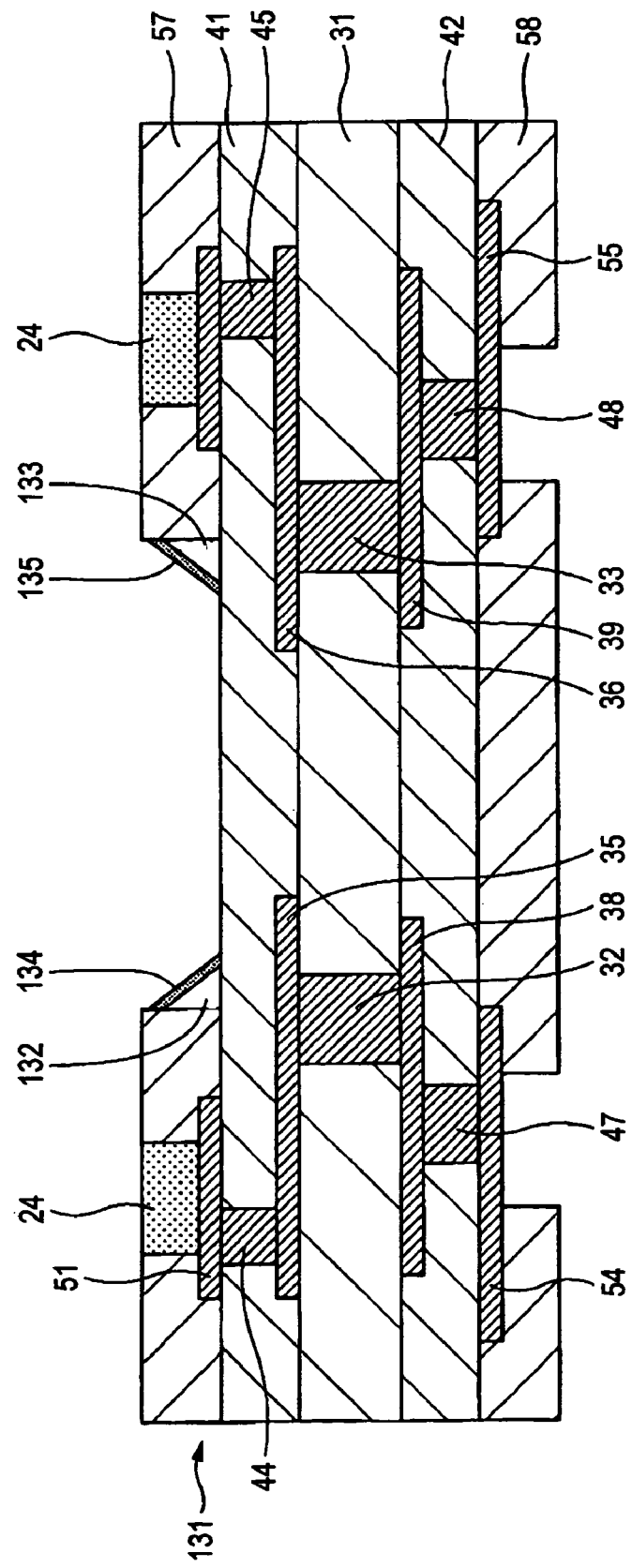
FIG. 33 is a diagram showing a manufacturing step of the optical-electrical substrate according to the fifth embodiment of the present invention (ninth).
Figure 34:
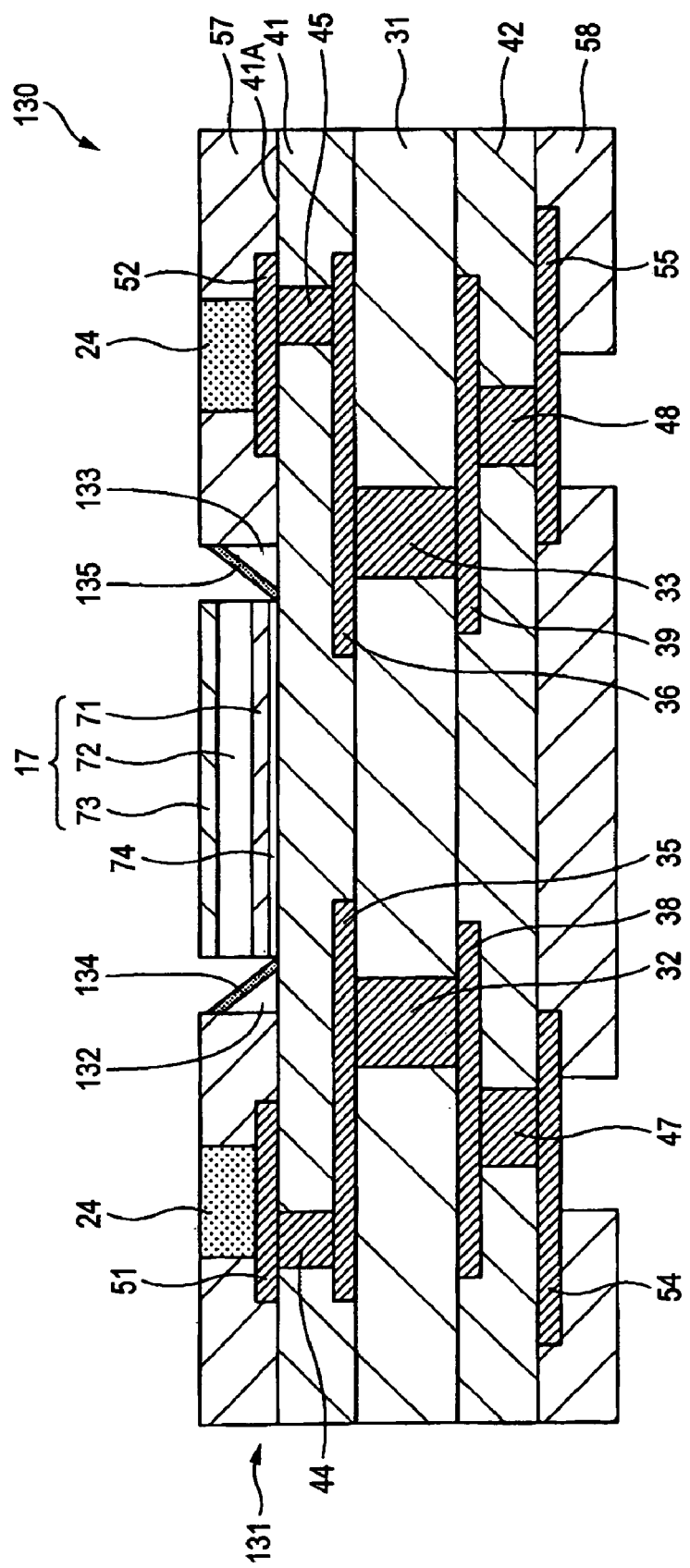
FIG. 34 is a diagram showing a manufacturing step of the optical-electrical substrate according to the fifth embodiment of the present invention (tenth).

The molds 145, 146 for insulating member formation will be described herein. Referring to FIGS. 26 and 33, the mold 145 for insulating member formation has a notched part 147 corresponding to a shape of the insulating member 132. An inclined surface 145B formed in a smooth surface is formed in the mold 145 for insulating member formation of the portion in which the notched part 147 is formed. The inclined surface 145B of the mold 145 for insulating member formation is means for forming an inclined surface 132A of the insulating member 132. An angle $\theta_9$ between the inclined surface 145B and a bottom surface 145A of the mold 145 for insulating member formation is substantially equal to the angle $\theta_7$ of the inclined surface 132A of the insulating member 132. The angle $\theta_9$ can be set at, for example, 45°.

By forming the insulating member 132 using the mold 145 for insulating member formation having the notched part 147 corresponding to a shape of the insulating member 132 thus, the inclined surface 132A on which the mirror 134 is formed can be formed without using a dicer, so that transmission loss of an optical signal by the mirror 134 can be reduced as compared with the related-art optical-electrical substrate 200.

Also, by forming the inclined surface 145B of the mold 145 for insulating member formation in a smooth surface, the inclined surface 132A of the insulating member 132 can be formed in a smooth surface, so that the transmission loss of the optical signal by the mirror 134 can be reduced further.

The bottom surface 145A of the mold 145 for insulating member formation is a surface in contact with an upper surface 41A of an insulating layer 41 in the case of forming the insulating member 132. Also, a side surface 145C of the mold 145 for insulating member formation is a surface almost perpendicular to the bottom surface 145A of the mold 145 for insulating member formation. A part of the side surface 145C of the mold 145 for insulating member formation is a surface in contact with a surface 57D of the solder resist 57 in the case of forming the insulating member 132.

The mold 145 for insulating member formation constructed as described above is constructed by a material capable of transmitting ultraviolet rays. As a material of the mold 145 for insulating member formation, for example, glass can be used.

Referring to FIG. 26, the mold 146 for insulating member formation has a notched part 148 corresponding to a shape of the insulating member 133. An inclined surface 146B formed in a smooth surface is formed in the mold 146 for insulating member formation of the portion in which the notched part 148 is formed. An angle $\theta_{10}$ between the inclined surface 146B and a bottom surface 146A of the mold 146 for insulating member formation is substantially equal to the angle $\theta_8$ of the inclined surface 133A of the insulating member 133. The angle $\theta_{10}$ can be set at, for example, 45°.

By forming the insulating member 133 using the mold 146 for insulating member formation having the notched part 148 corresponding to a shape of the insulating member 133 thus, the inclined surface 133A on which the mirror 135 is formed can be formed without using a dicer, so that transmission loss of an optical signal by the mirror 135 can be reduced as compared with the related-art optical-electrical substrate 200.

Also, by forming the inclined surface 146B of the mold 146 for insulating member formation in a smooth surface, the inclined surface 133A of the insulating member 133 can be formed in a smooth surface, so that the transmission loss of the optical signal by the mirror 135 can be reduced further.

The bottom surface 146A of the mold 146 for insulating member formation is a surface in contact with the upper surface 41A of the insulating layer 41 in the case of forming the insulating member 133. Also, a side surface 146C of the mold 146 for insulating member formation is a surface almost perpendicular to the bottom surface 146A of the mold 146 for insulating member formation. A part of the side surface 146C of the mold 146 for insulating member formation is a surface in contact with a surface 57E of the solder resist 57 in the case of forming the insulating member 133.

The mold 146 for insulating member formation constructed as described above is constructed by a material capable of transmitting ultraviolet rays. As a material of the mold 146 for insulating member formation, for example, glass can be used.

Figure 27:
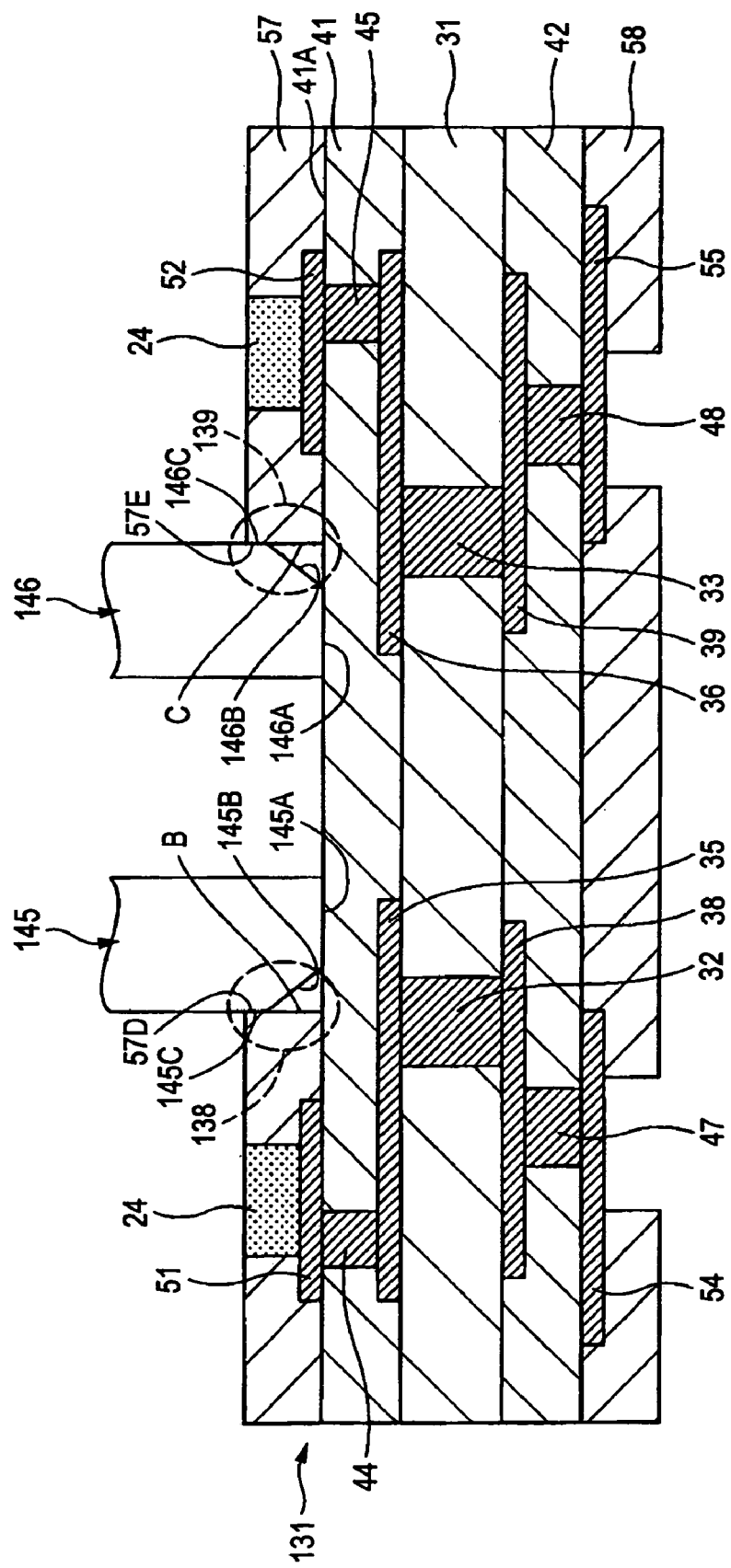
FIG. 27 is a diagram showing a manufacturing step of the optical-electrical substrate according to the fifth embodiment of the present invention (third).

Then, in a step shown in FIG. 27, the mold 145 for insulating member formation is pressed on the wiring substrate 131 so that a step part 138 is opposed to the mold 145 for insulating member formation of the portion in which the notched part 147 is formed and also, the mold 146 for insulating member formation is pressed on the wiring substrate 131 so that a step part 139 is opposed to the mold 146 for insulating member formation of the portion in which the notched part 148 is formed. Consequently, space B is formed between the step part 138 and the mold 145 for insulating member formation and space C is formed between the step part 139 and the mold 146 for insulating member formation. The space B is space for forming the insulating member 132. The space C is space for forming the insulating member 133.

Also, when the mold 145 for insulating member formation is pressed on the wiring substrate 131, a part of the side surface 145C of the mold 145 for insulating member formation could be brought into contact with the surface 57D of the solder resist 57 while bringing the bottom surface 145A of the mold 145 for insulating member formation into contact with the upper surface 41A of the insulating layer 41. By bringing the side surface 145C and the bottom surface 145A of the mold 145 for insulating member formation into contact with the wiring substrate 131 thus, the mold 145 for insulating member formation can stably be pressed on the wiring substrate 131.

Also, when the mold 146 for insulating member formation is pressed on the wiring substrate 131, a part of the side surface 146C of the mold 146 for insulating member formation could be brought into contact with the surface 57E of the solder resist 57 while bringing the bottom surface 146A of the mold 146 for insulating member formation into contact with the upper surface 41A of the insulating layer 41. By bringing the side surface 146C and the bottom surface 146A of the mold 146 for insulating member formation into contact with the wiring substrate 13 thus, the mold 146 for insulating member formation can stably be pressed on the wiring substrate 131.

Figure 28:
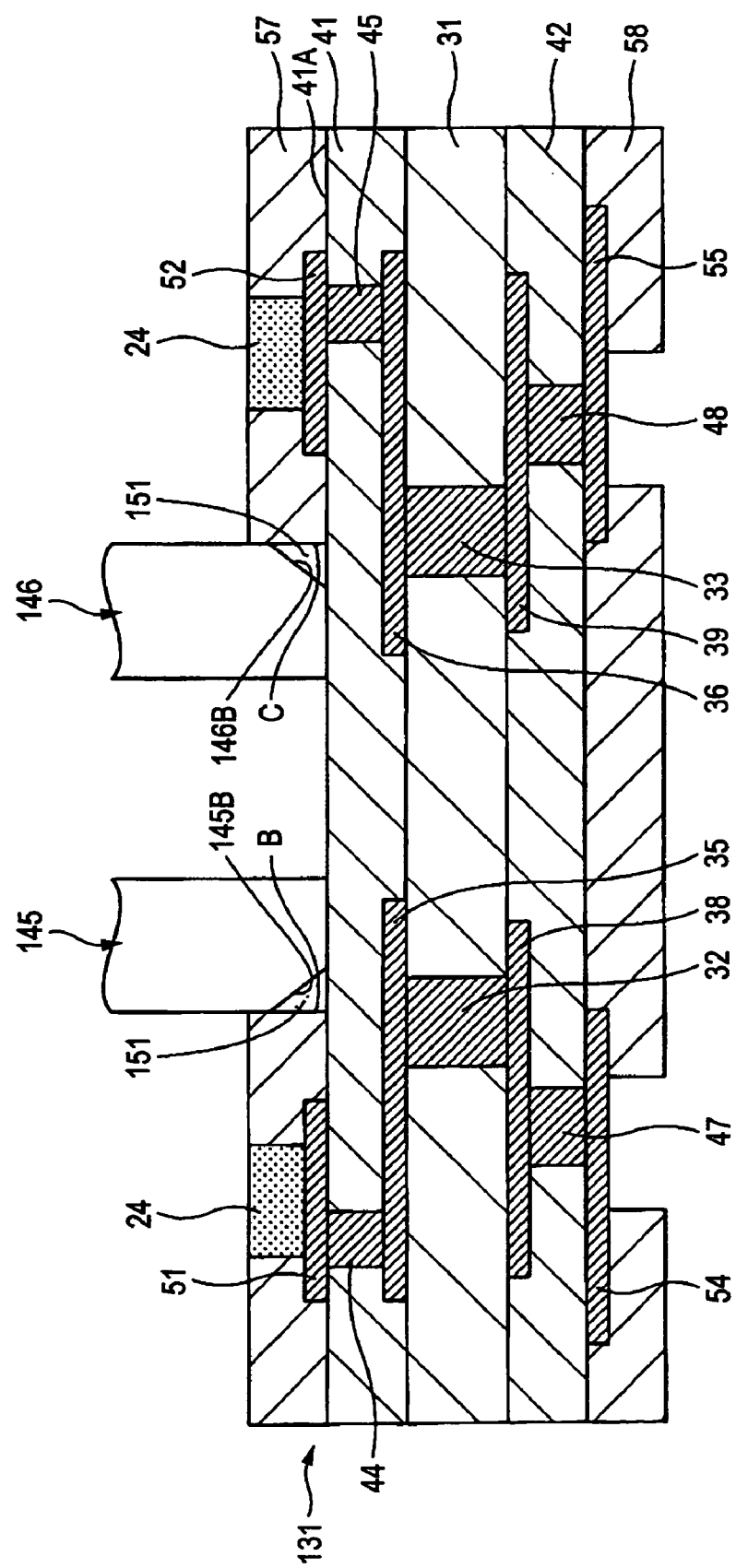
FIG. 28 is a diagram showing a manufacturing step of the optical-electrical substrate according to the fifth embodiment of the present invention (fourth).

Then, in a step shown in FIG. 28, the spaces B, C are filled with a liquid ultraviolet curing resin 151 (a liquid resin filling step). Concretely, the spaces B, C are filled with the liquid ultraviolet curing resin 151 by a capillary phenomenon. The liquid ultraviolet curing resin 151 with which the spaces B, C are filled results in the insulating members 132, 133 by being cured in a step shown in FIG. 29 described below.

Figure 29:
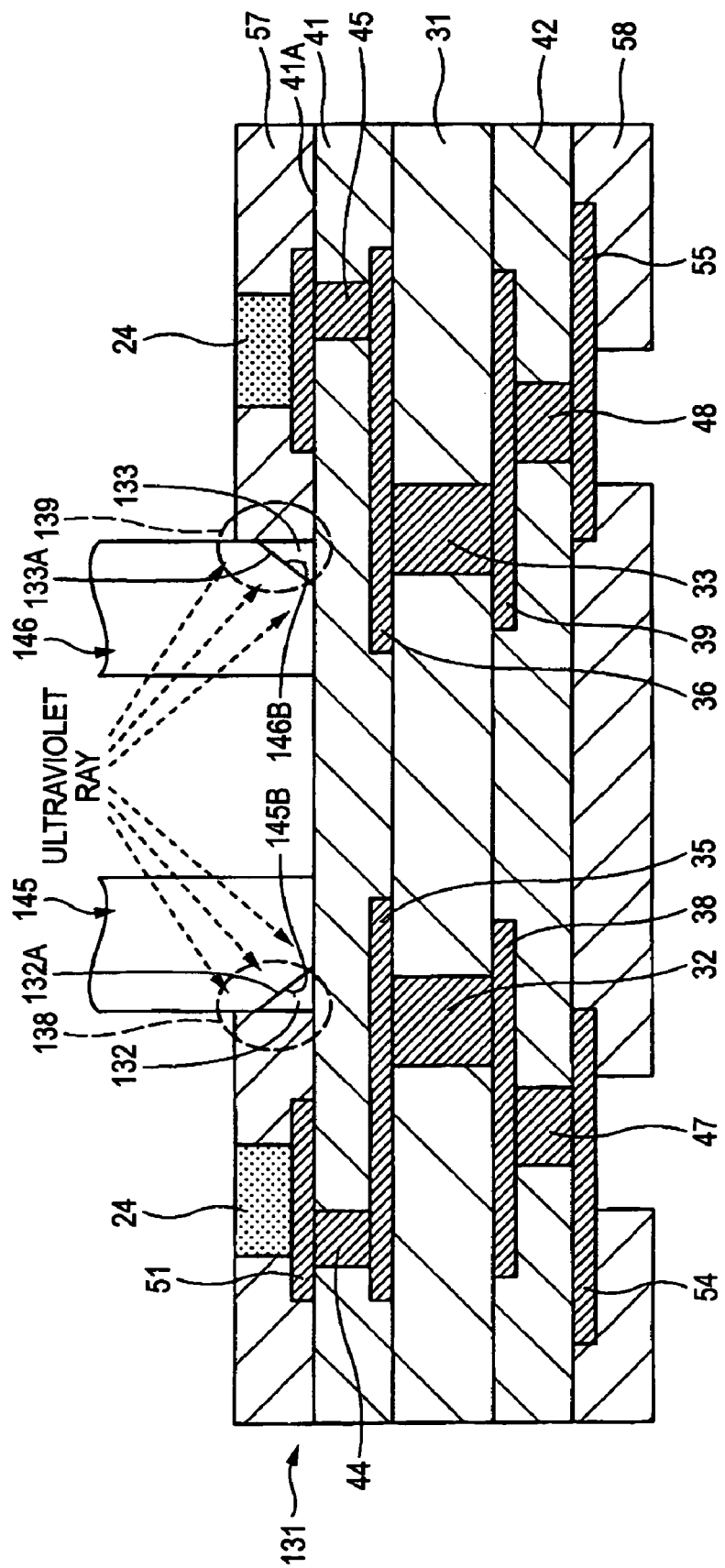
FIG. 29 is a diagram showing a manufacturing step of the optical-electrical substrate according to the fifth embodiment of the present invention (fifth).

Then, in the step shown in FIG. 29, the liquid ultraviolet curing resin 151 is irradiated with ultraviolet rays through the molds 145, 146 for insulating member formation pressed on the wiring substrate 131 and the liquid ultraviolet curing resin 151 is cured (a resin curing step). Consequently, the insulating member 132 having the smooth inclined surface 132A (a surface on which the mirror 134 is formed) is formed in the step part 138 of the wiring substrate 131 and also, the insulating member 133 having the smooth inclined surface 133A (a surface on which the mirror 135 is formed) is formed in the step part 139 of the wiring substrate 131 (see FIG. 30).

Figure 30:
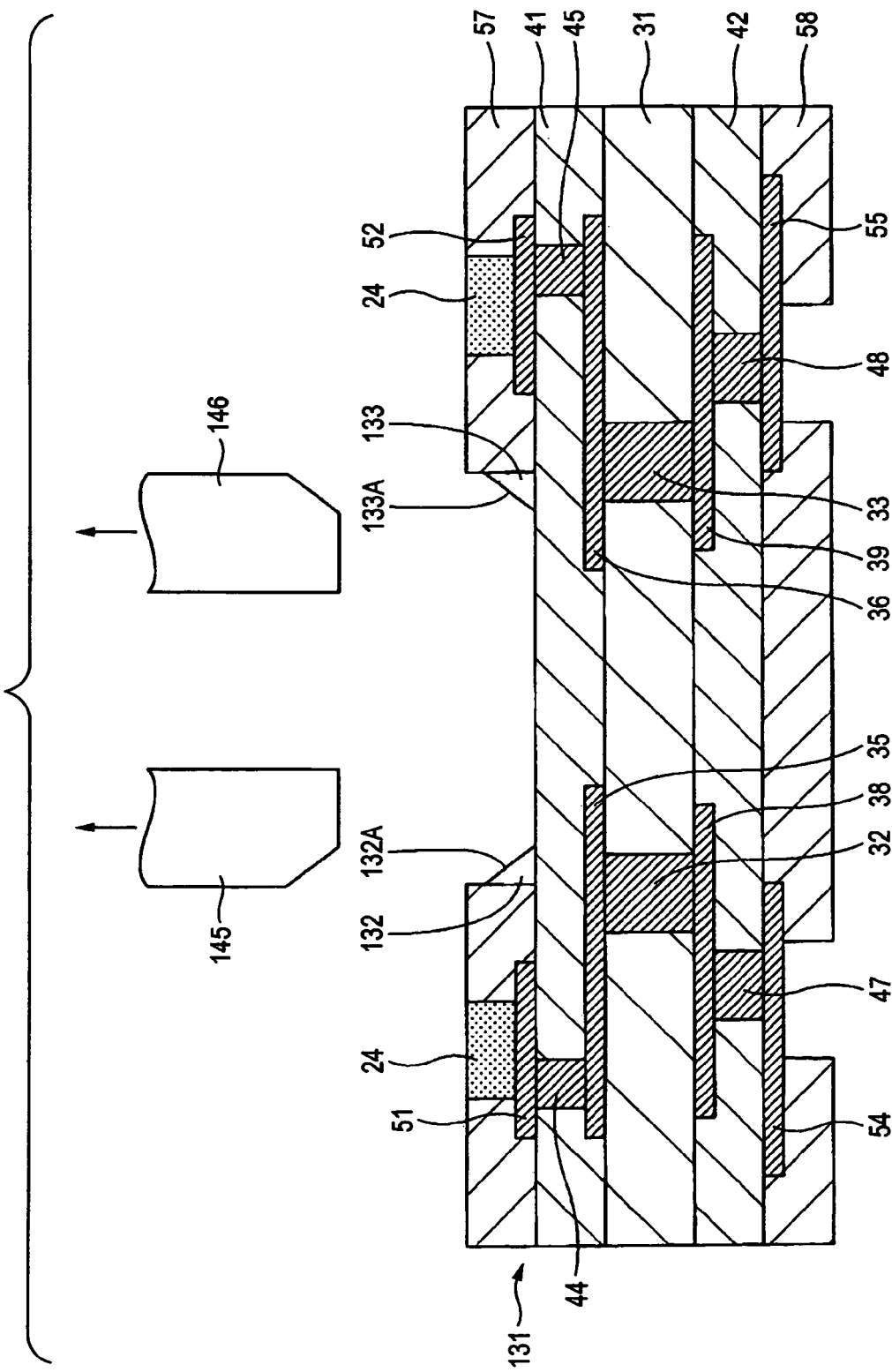
FIG. 30 is a diagram showing a manufacturing step of the optical-electrical substrate according to the fifth embodiment of the present invention (sixth).

Then, in a step shown in FIG. 30, the molds 145, 146 for insulating member formation are removed from the wiring substrate 131 (a removal step of the molds for insulating member formation).

Figure 31:
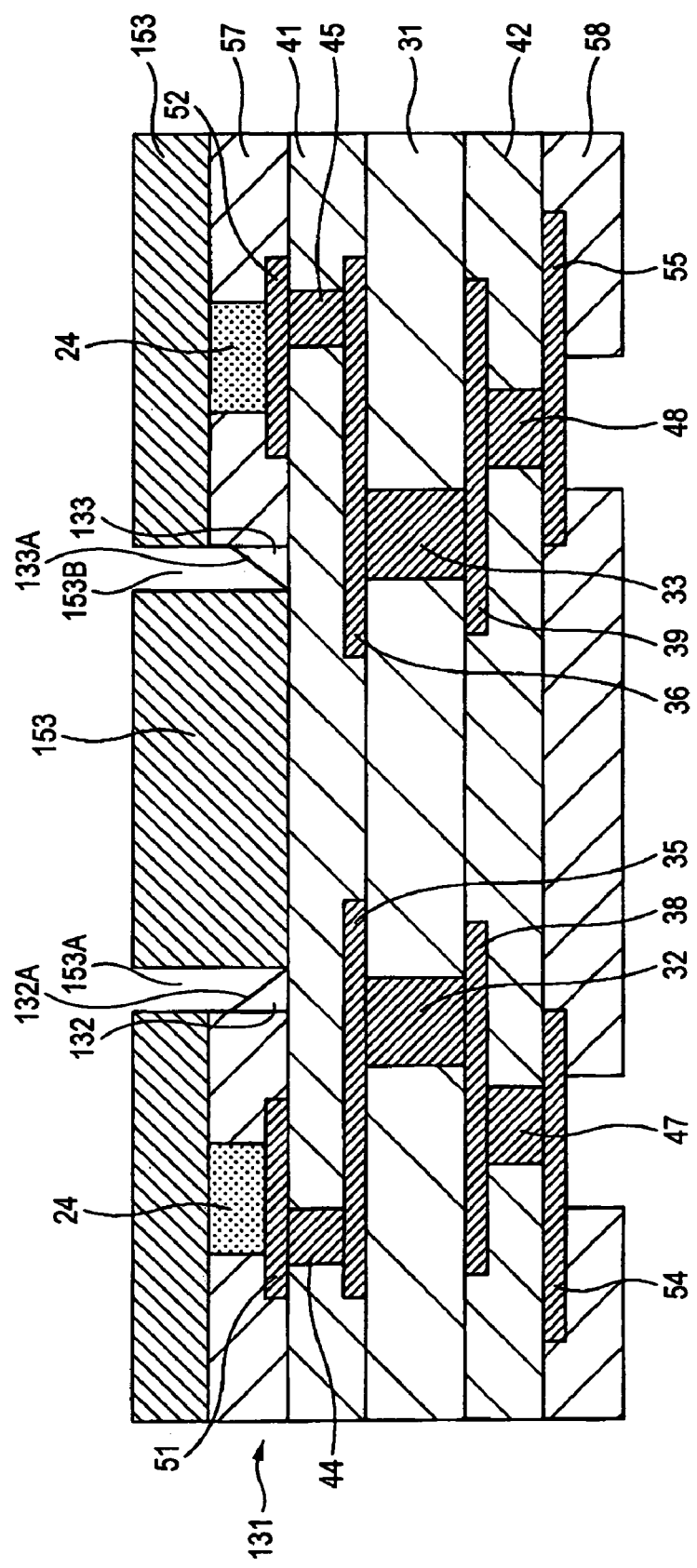
FIG. 31 is a diagram showing a manufacturing step of the optical-electrical substrate according to the fifth embodiment of the present invention (seventh).

Then, in a step shown in FIG. 31, a resist film 153 having openings 153A, 153B is formed on the upper surface side of the wiring substrate 131 in which the insulating members 132, 133 are formed. The opening 153A is formed so as to expose only the inclined surface 132A of the insulating member 132. Also, the opening 153B is formed so as to expose only the inclined surface 133A of the insulating member 133.

Figure 32:
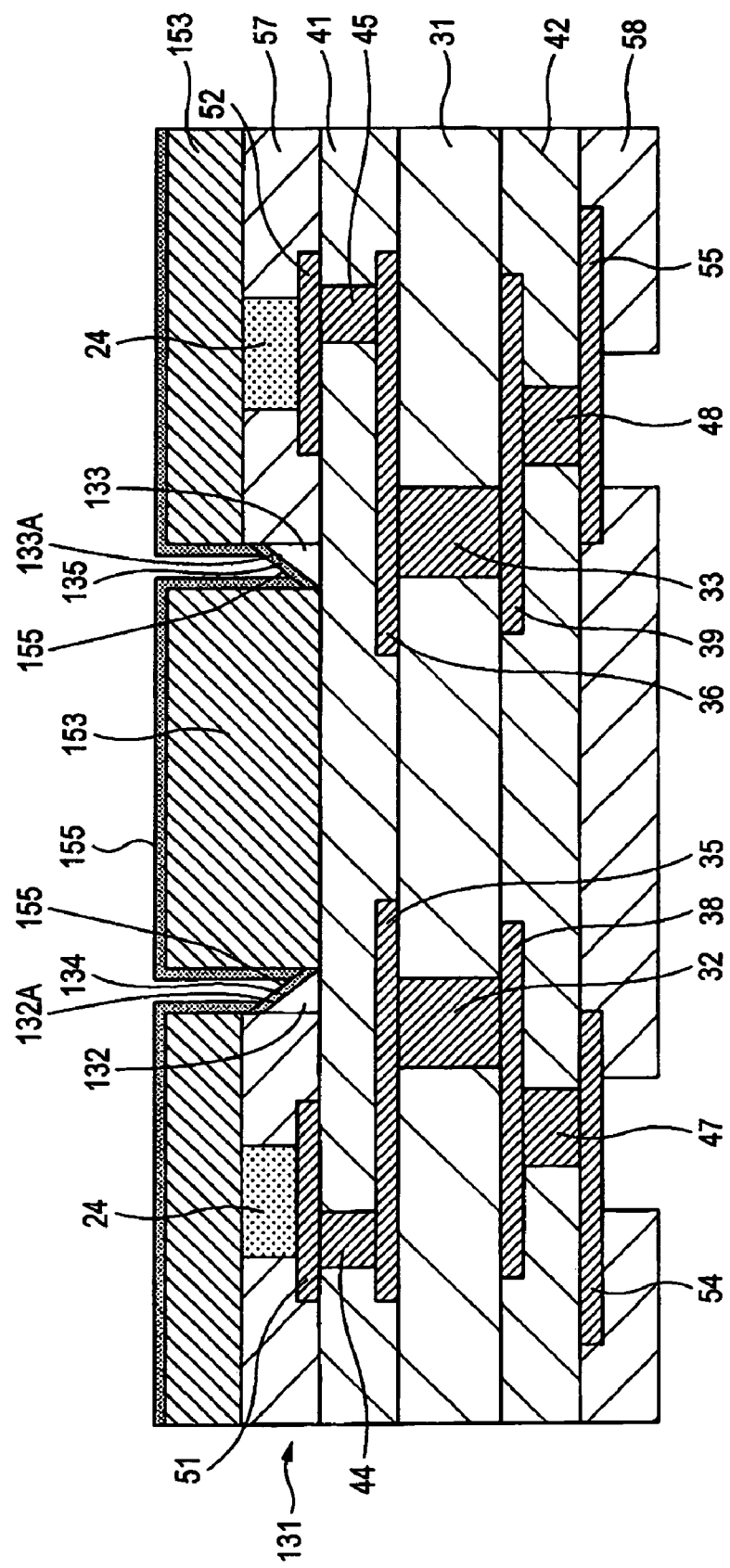
FIG. 32 is a diagram showing a manufacturing step of the optical-electrical substrate according to the fifth embodiment of the present invention (eighth).

Then, in a step shown in FIG. 32, by a sputtering method or a vacuum evaporation method, a metal film 155 is formed on the inclined surfaces 132A, 133A of the insulating members 132, 133 and the mirrors 134, 135 made of the metal film 155 are formed on the inclined surfaces 132A, 133A of the insulating members 132, 133 (a mirror formation step). In this case, the metal film 155 is also formed on side surfaces and an upper surface of the resist film 153. As the metal film 155, for example, an Au film can be used. Also, when the Au film is used as the metal film 155, a thickness of the metal film 155 can be set at, for example, 0.2 µm to 1.0 µm.

By forming the mirrors 134, 135 on the inclined surfaces 132A, 133A formed in smooth surfaces thus, reflective surfaces (surfaces of the mirrors 134, 135 for reflecting an optical signal) of the mirrors 134, 135 can be formed in smooth surfaces, so that transmission loss of the optical signal by the mirrors 134, 135 can be reduced.

Then, in a step shown in FIG. 33, the resist film 153 shown in FIG. 32 is removed. Then, in a step shown in FIG. 34, an optical waveguide 17 separately made is bonded on the insulating layer 41 located between the mirrors 134, 135 by an adhesive 74. Consequently, the optical-electrical substrate 130 is manufactured.

According to the manufacturing method of the optical-electrical substrate of the embodiment, after the molds 145, 146 for insulating member formation are pressed on the wiring substrate 131 so that the step parts 138, 139 of the wiring substrate 131 are opposed to the molds 145, 146 for insulating member formation of the portions in which the notched parts 147, 148 are formed, the spaces B, C formed by the step parts 138, 139 and the molds 145, 146 for insulating member formation are filled with the liquid ultraviolet curing resin 151 and thereafter, the liquid ultraviolet curing resin 151 is irradiated with ultraviolet rays through the molds 145, 146 for insulating member formation pressed on the wiring substrate 131 and the liquid ultraviolet curing resin 151 is cured and the insulating members 132, 133 having the smooth inclined surfaces 132A, 133A are formed and thereafter, the metal film 155 are formed on the smooth inclined surfaces 132A, 133A and the mirrors 134, 135 are formed and thereby, reflective surfaces (surfaces of the mirrors 134, 135 for reflecting an optical signal) of the mirrors 134, 135 are formed in smooth surfaces, so that transmission loss of the optical signal by the mirrors 134, 135 can be reduced.

Figure 36:
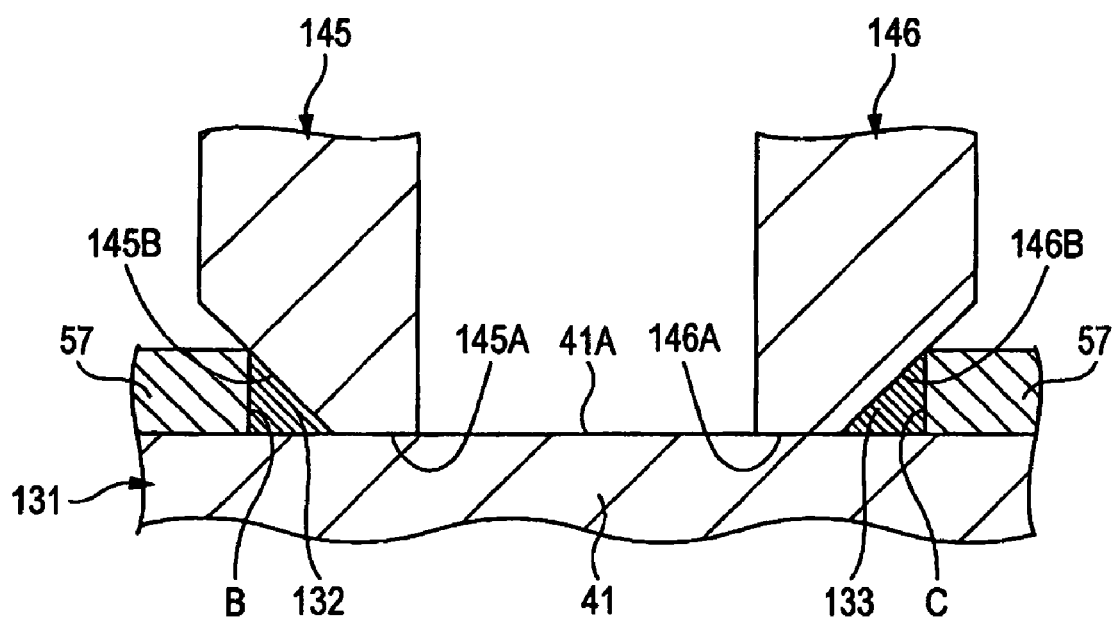
FIG. 36 is a diagram showing another manufacturing step of the optical-electrical substrate according to the fifth embodiment of the present invention.

FIG. 36 is a diagram showing another manufacturing step of the optical-electrical substrate according to the fifth embodiment of the present invention. In FIG. 36, the same numerals are assigned to the same components as those of the optical-electrical substrate 130 of the fifth embodiment.

In addition, as shown in FIG. 36, the insulating members 132, 133 may be formed by bringing the bottom surfaces 145A, 146A of the molds 145, 146 for insulating member formation into contact with the upper surface 41A of the insulating layer 41 and also bringing the inclined surfaces 145B, 146B of the molds 145, 146 for insulating member formation into contact with the corners of the solder resist 57.

Also, the optical waveguide 111 shown in FIGS. 21 and 22 may be disposed instead of the optical waveguide 17 disposed in the optical-electrical substrate 130 of the embodiment.

The preferred embodiments of the present invention have been described above in detail, but the present invention is not limited to such particular embodiments, and various modifications and changes can be made within the gist of the present invention described in the claims.

The present invention can be applied to an optical-electrical substrate comprising an optical waveguide which is disposed on a wiring substrate and transmits an optical signal, and a mirror for reflecting the optical signal.

What is claimed is:

1. A manufacturing method of an optical-electrical substrate comprising a wiring substrate, an optical waveguide which is disposed on the wiring substrate and transmits an optical signal, and a mirror for reflecting the optical signal, the method comprising:
   an insulating member formation step of forming an insulating member having a smooth inclined surface on the wiring substrate,
   a mirror formation step of forming the mirror on the smooth inclined surface, and
   an optical waveguide formation step of forming an optical waveguide on the wiring substrate after the mirror formation step.

2. A manufacturing method of an optical-electrical substrate as claimed in claim 1, wherein the insulating member formation step includes:
   a preparation step of a mold for insulating member formation, the mold having a groove part corresponding to a shape of the insulating member and also transmitting ultraviolet rays,
   a liquid resin filling step of filling the groove part with a liquid ultraviolet curing resin after the mold for insulating member formation is pressed on the wiring substrate so that the groove part is opposed to the wiring substrate,
   a resin curing step of irradiating the liquid ultraviolet curing resin with ultraviolet rays through the mold for insulating member formation pressed on the wiring substrate and curing the liquid ultraviolet curing resin, and
   a removal step of the mold for insulating member formation from the wiring substrate.

3. A manufacturing method of an optical-electrical substrate as claimed in claim 2, wherein a surface of the mold for insulating member formation of the portion corresponding to the groove part is a smooth surface.

4. A manufacturing method of an optical-electrical substrate as claimed in claim 1, wherein the wiring substrate has a step part in the portion corresponding to a formation region of the mirror, and the insulating member formation step includes:
   a preparation step of a mold for insulating member formation, the mold having a notched part corresponding to a shape of the insulating member and also transmitting ultraviolet rays,
   a liquid resin filling step of filling space formed by the step part and the mold for insulating member formation with a liquid ultraviolet curing resin after the mold for insulating member formation is pressed on the wiring substrate so that the step part of the wiring substrate is opposed to the mold for insulating member formation of the portion in which the notched part is formed,
   a resin curing step of irradiating the liquid ultraviolet curing resin with ultraviolet rays through the mold for insulating member formation pressed on the wiring substrate and curing the liquid ultraviolet curing resin, and
   a removal step of the mold for insulating member formation from the wiring substrate.

5. A manufacturing method of an optical-electrical substrate as claimed in claim 4, wherein a surface of the mold for insulating member formation of the portion corresponding to the notched part is a smooth surface.

* * * * *